United States Patent
Kim et al.

(10) Patent No.: US 9,578,268 B2
(45) Date of Patent: Feb. 21, 2017

(54) RAMP SIGNAL CALIBRATION APPARATUS AND METHOD AND IMAGE SENSOR INCLUDING THE RAMP SIGNAL CALIBRATION APPARATUS

(71) Applicants: SAMSUNG ELECTRONICS CO., LTD., Suwon-si (KR); Dongguk University Industry-Academic Cooperation Foundation, Seoul (KR)

(72) Inventors: Dae-Yun Kim, Seoul (KR); Min-Kyu Song, Seoul (KR); Yeon-Seong Hwang, Incheon (KR); Jae-Jung Park, Hwaseong-si (KR)

(73) Assignees: SAMSUNG ELECTRONICS CO., LTD., Suwon-si (KR); Dongguk University Industry-Academic Cooperation Foundation, Seoul (KR)

( * ) Notice: Subject to any disclaimer, the term of this patent is extended or adjusted under 35 U.S.C. 154(b) by 66 days.

(21) Appl. No.: 14/625,119

(22) Filed: Feb. 18, 2015

(65) Prior Publication Data

US 2015/0350585 A1 Dec. 3, 2015

(30) Foreign Application Priority Data

May 29, 2014 (KR) .................. 10-2014-0065104

(51) Int. Cl.
*H04N 3/14* (2006.01)
*H04N 5/335* (2011.01)
(Continued)

(52) U.S. Cl.
CPC ........... *H04N 5/378* (2013.01); *H03M 1/1014* (2013.01); *H03M 1/123* (2013.01); *H03M 1/144* (2013.01); *H03M 1/56* (2013.01)

(58) Field of Classification Search
CPC .................... H04N 3/1568; H04N 5/37455
See application file for complete search history.

(56) References Cited

U.S. PATENT DOCUMENTS 6,529,421 B1  3/2003  Marr et al.
7,679,542 B2  3/2010  Ham et al.
(Continued)

FOREIGN PATENT DOCUMENTS

KR  10-0790969 B1  1/2008
KR  10-0913797 B1  8/2009
(Continued)

*Primary Examiner* — Twyler Haskins
*Assistant Examiner* — Carramah J Quiett
(74) *Attorney, Agent, or Firm* — Sughrue Mion, PLLC

(57) ABSTRACT

Provided are a ramp signal calibration apparatus and method and image sensor including the apparatus. The apparatus includes: an analog-to-digital converter (ADC) including a trimmable transistor having a gain value that varies according to stored data, and configured to receive a ramp signal in a state where the gain value is a first gain value, and to output first and second output signals; a subtractor configured to calculate a difference between the first and second output signals; a digital comparator configured to compare the difference with a reference value and to determine whether a slope of the ramp signal has changed; and a counter configured to change the stored data based on whether the slope of the ramp signal has changed, wherein when the counter changes the data, the first gain value of the trimmable transistor is changed to a second gain value according to the changed data.

17 Claims, 19 Drawing Sheets

(51) Int. Cl.
*H04N 5/378* (2011.01)
*H03M 1/10* (2006.01)
H03M 1/12 (2006.01)
H03M 1/14 (2006.01)
H03M 1/56 (2006.01)

(56) References Cited

U.S. PATENT DOCUMENTS

| | | |
|---|---|---|
| 7,760,008 B2 | 7/2010 | Peng et al. |
| 8,081,243 B2 | 12/2011 | Chou |
| 8,441,387 B2 | 5/2013 | Wang |
| 8,482,647 B2 | 7/2013 | Kim et al. |
| 8,605,173 B2 | 12/2013 | Lee et al. |
| 2007/0046802 A1 | 3/2007 | Ham et al. |
| 2009/0279809 A1 | 11/2009 | Richardson |
| 2011/0194007 A1 | 8/2011 | Kim et al. |
| 2012/0038809 A1 | 2/2012 | Lee et al. |
| 2012/0169381 A1 | 7/2012 | Mei |
| 2012/0194367 A1* | 8/2012 | Wang .................. H03M 1/1014 341/120 |
| 2012/0195502 A1 | 8/2012 | Wang et al. |

FOREIGN PATENT DOCUMENTS

| | | |
|---|---|---|
| KR | 10-2011-0113917 A | 10/2011 |
| KR | 10-1077408 B1 | 10/2011 |
| KR | 10-2012-0116570 A | 2/2012 |
| KR | 10-1211082 B1 | 12/2012 |
| KR | 10-1293057 B1 | 8/2013 |
| WO | 2012/074287 A2 | 6/2012 |

* cited by examiner

RAMP SIGNAL CALIBRATION APPARATUS AND METHOD AND IMAGE SENSOR INCLUDING THE RAMP SIGNAL CALIBRATION APPARATUS

This application claims priority from Korean Patent Application No. 10-2014-0065104, filed on May 29, 2014 in the Korean Intellectual Property Office, the disclosure of which is incorporated herein by reference in its entirety.

BACKGROUND

1. Field

Apparatuses and methods consistent with exemplary embodiments relate to a ramp signal calibration apparatus and method and an image sensor including the ramp signal calibration apparatus.

2. Description of the Related Art

An image pickup device includes an image sensor. An image sensor is a semiconductor device that converts optical information into an electrical signal. Examples of the image sensor include a charge coupled device (CCD) image sensor and a complementary metal-oxide semiconductor (CMOS) image sensor.

A CMOS image sensor uses a column-parallel analog-to-digital conversion structure in order to improve power efficiency. An analog-to-digital converter (ADC) included in the CMOS image sensor is located in a small pixel column pitch. Therefore, a single slope analog-to-digital converter (SS ADC) and a two-step single slope analog-to-digital converter (TS SS ADC) may be used. The SS ADC is very small in size and has a high reliability. The TS SS ADC performs a coarse analog-to-digital conversion process for converting high-order bits and a fine analog-to-digital conversion process for converting lower-order bits in order to reduce the conversion time.

SUMMARY

Aspects of one or more exemplary embodiments provide a ramp signal calibration apparatus that can improve the linearity of an output of an image sensor and reduce fixed pattern noise (FPN) by calibrating the slope of a ramp signal.

Aspects of one or more exemplary embodiments also provide an image sensor that can improve the linearity of an output thereof and reduce FPN by calibrating the slope of a ramp signal.

Aspects of one or more exemplary embodiments also provide a ramp signal calibration method that can improve the linearity of an output of an image sensor and reduce FPN by calibrating the slope of a ramp signal.

However, it is understood that aspects of one or more other exemplary embodiments are not restricted to exemplary embodiments set forth herein. The above and other aspects of exemplary embodiments will become more apparent to one of ordinary skill in the art to which exemplary embodiments pertain by referencing the detailed description of exemplary embodiments given below.

According to an aspect of an exemplary embodiment, there is provided a ramp signal calibration apparatus, the ramp signal calibration apparatus including: an analog-to-digital converter (ADC) including a trimmable transistor having a gain value that varies according to stored data, the ADC configured to receive a ramp signal in a state where the gain value is set to a first gain value, and to output a first output signal and a second output signal based on the received ramp signal; a subtractor configured to calculate a difference between the first output signal and the second output signal; a digital comparator configured to compare the calculated difference with a reference value and to determine whether a slope of the ramp signal has changed based on a result of the comparing; and a counter configured to change the stored data based on the determining of whether the slope of the ramp signal has changed; wherein when the counter changes the stored data, the first gain value of the trimmable transistor is changed to a second gain value according to the changed data.

According to an aspect of another exemplary embodiment, there is provided an image sensor, the image sensor including: a pixel array including unit pixels arranged two-dimensionally in a matrix pattern and vertical signal lines respectively corresponding to columns of the matrix pattern; a plurality of analog-to-digital converters (ADCs), each of which includes a memory configured to store data and a trimmable transistor having a gain value that varies according to the data stored in the memory, and each of which is configured to receive a ramp signal in a state where the gain value is set to a first gain value, and to convert an analog signal output through a corresponding vertical signal line, among the vertical signal lines, into a digital signal; and a calibration circuit connected to the memory of each of the plurality of ADCs and configured to calibrate the gain value of each of the plurality of ADCs, wherein the calibration circuit changes the data stored in the memory by determining whether a slope of the ramp signal has changed, and the first gain value of the trimmable transistor is changed to a second gain value according to the changed data stored in the memory.

According to an aspect of another exemplary embodiment, there is provided a calibration circuit configured to calibrate a gain value of each of a plurality of analog-to-digital converters (ADCs), the calibration circuit including: a subtractor configured to obtain, from an ADC among the plurality of ADCs, a first output signal and a second output signal corresponding to a ramp signal, and to calculate a difference between the first output signal and the second output signal; a comparator configured to compare the calculated difference with a reference value and to determine whether a slope of the ramp signal has changed based on a result of the comparing; and a counter configured to change the gain value of the ADC based on the determining of whether the slope of the ramp signal has changed.

BRIEF DESCRIPTION OF THE DRAWINGS

The above and other aspects and features will become more apparent by describing in detail exemplary embodiments with reference to the attached drawings, in which.

DETAILED DESCRIPTION OF EXEMPLARY EMBODIMENTS

Figure 1:
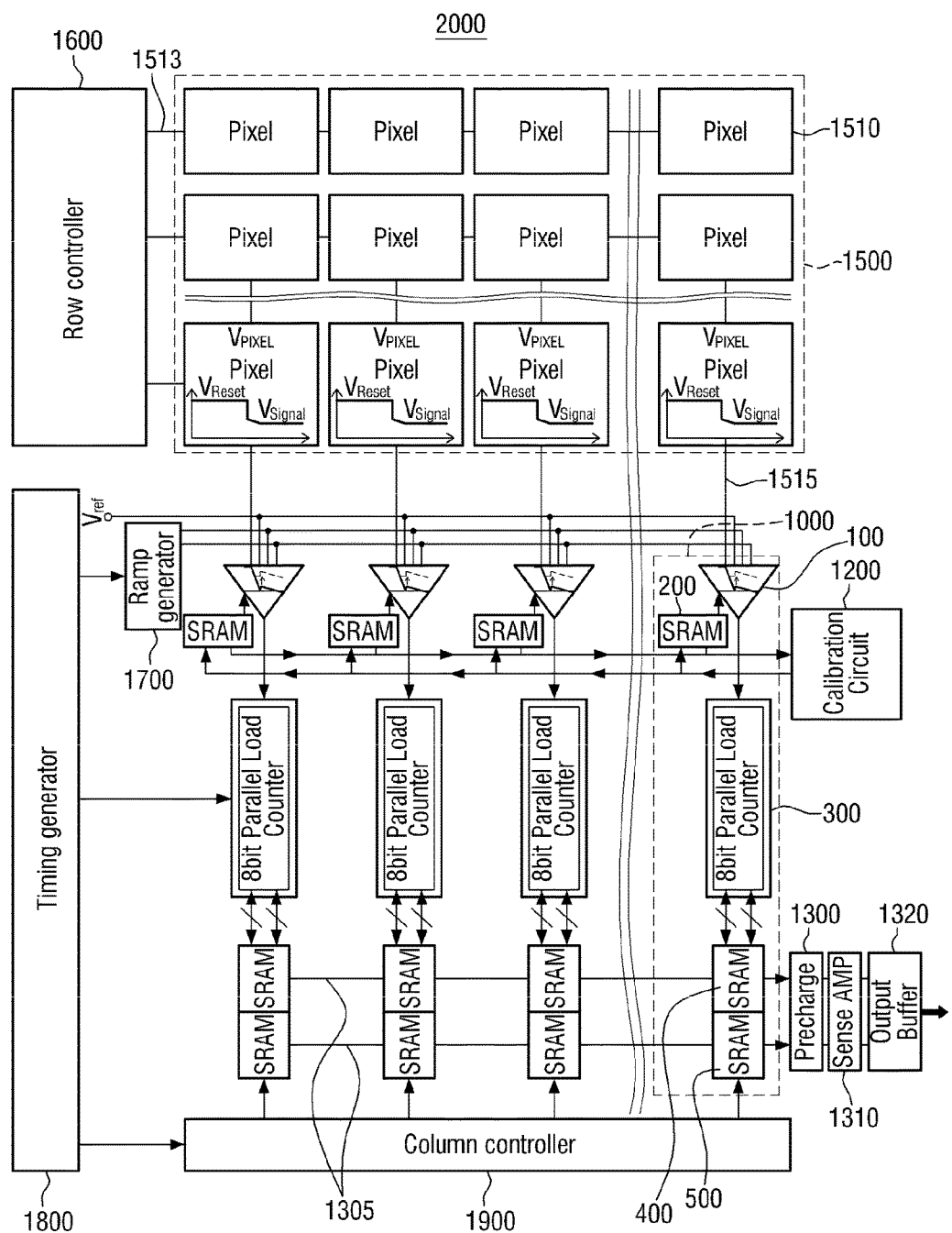
FIG. 1 is a block diagram of an image sensor according to an exemplary embodiment.

Advantages and features of exemplary embodiments and methods of accomplishing the same may be understood more readily by reference to the following detailed description of exemplary embodiments and the accompanying drawings. An exemplary embodiment may, however, be embodied in many different forms and should not be construed as being limited to exemplary embodiments set forth herein. Rather, these exemplary embodiments are provided so that this disclosure will be thorough and complete and will fully convey the inventive concept to those skilled in the art, and the present inventive concept will only be defined by the appended claims. Like reference numerals refer to like elements throughout the specification.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments are described herein with reference to cross-section illustrations that are schematic illustrations of exemplary embodiments (and intermediate structures). As such, variations from the shapes of the illustrations as a result, for example, of manufacturing techniques and/or tolerances, are to be expected. Thus, these exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

A ramp signal calibration apparatus and method and an image sensor including the ramp signal calibration apparatus according to exemplary embodiments will now be described with reference to FIGS. 1 through 14.

FIG. 1 is a block diagram of an image sensor 2000 according to an exemplary embodiment.

Referring to FIG. 1, the image sensor 2000 according to the present exemplary embodiment includes a plurality of analog-to-digital converters (ADCs) 1000, a calibration circuit 1200, a precharge unit 1300 (e.g., precharger), a sense amplifier 1310, an output buffer 1320, a pixel array 1500, a row controller 1600, a ramp generator 1700, a timing generator 1800, and a column controller 1900.

The pixel array 1500 may include unit pixels 1510 arranged two-dimensionally in a matrix pattern and vertical signal lines 1515 respectively corresponding to columns of the matrix pattern. The unit pixels 1510 of the pixel array 1500 convert optical images into electrical output signals. The pixel array 1500 may be driven in response to a plurality of driving signals including a row select signal, a reset signal, and a charge transfer signal received from the row controller 1600. In addition, the electrical output signals may be provided to the ADCs 1000 through the vertical signal lines 1515, respectively. The pixel array 1500 may include a plurality of complementary metal oxide semiconductor (CMOS) image pixels. The image pixels may be arranged in a matrix pattern (P(i, j)).

The unit pixels 1510 included in the pixel array 1500 may be arranged in a Bayer pattern or a chess mosaic pattern. If Bayer pattern technology is employed, the unit pixels 1510 of the pixel array 1500 may be arranged to receive red light (R), green light (G), and blue light (B). However, it is understood that one or more other exemplary embodiments are not limited thereto, and the arrangement pattern of the unit pixels 1510 in the pixel array 1500 can be changed to any pattern. For example, in one or more other exemplary embodiments, the unit pixels 1510 of the pixel array 1500 may be arranged to receive magenta light (Mg), yellow light (Y), cyan light (Cy), and/or white light (W).

The image sensor 2000 that drives and controls each unit pixel 1510 of the pixel array 1500, that is, the ADCs 1000, the calibration circuit 1200, the precharge unit 1300, the sense amplifier 1310, the output buffer 1320, the pixel array 1500, the row controller 1600, the ramp generator 1700, and the column controller 1900 may be integrated onto one chip (semiconductor substrate), together with the pixel array 1500.

Each of the unit pixels 1510 may include a photoelectric converter (e.g., a photodiode) and three transistors, that is, a transfer transistor that transfers electric charges generated by photoelectric conversion of the photoelectric converter to a floating diffuser (FD), a reset transistor that controls an electric potential of the FD, and an amplification transistor that outputs a signal according to the electric potential of the FD. However, it is understood that one or more other exemplary embodiments are not limited thereto. For example, according to another exemplary embodiment, each of the unit pixels 1510 may include four transistors including a select transistor that selects pixels in addition to the above three transistors. Thus, it is understood that, in one or more other exemplary embodiments, the structure of each of the unit pixels 1510 can be changed to any structure such as a 3-transistor structure (3T), a 4-transistor structure (4T), a 5-transistor structure (5T), etc.

The unit pixels 1510 of the pixel array 1500 may be arranged in a two-dimensional pattern having m columns and n rows. A row control line 1513 may be provided in each row of the pixel array 1500, and the vertical signal line 1515 may be provided in each column of the pixel array 1500. An end of each of the row control lines 1513 is connected to an output terminal of the row controller 1600 that corresponds to each row of the pixel array 1500. The row controller 1600 includes a shift register, etc., and can control the row address or row scan of the pixel array 1500 using the row control lines 1513.

Each of the ADCs 1000 may convert an analog signal into a digital signal and output the digital signal. Specifically, each of the ADCs 1000 may convert an analog signal output from each unit pixel 1510 in a corresponding column of the pixel array 1500 into a digital signal and output the digital signal.

Each of the ADCs 1000 may include a comparator 100, a memory 200, a parallel load counter (PLC) 300 (e.g., an 8-bit PLC), a first memory 400, and a second memory 500.

The comparator 100 may include a trimmable transistor 10 whose gain value varies according to data stored in the memory 200. The trimmable transistor 10 may include a reference transistor, N metal oxide semiconductor (MOS) transistors, and N switches connected in parallel. The trimmable transistor 10 may have a gain value gm that can control the amount of current flowing therethrough, and the gain value gm may be controlled by the N MOS transistors, which will be described in detail below.

The comparator 100 receives a pixel signal Vpixel (see FIG. 2) output from a unit pixel 1510 in an mth column of the pixel array 1500 through a corresponding vertical signal line 1515 and compares the pixel signal Vpixel with a reference voltage Vref and a coarse ramp signal Vcoarse_ramp (hereinafter, shortened to Vc) or a fine ramp signal Vfine_ramp (hereinafter, shortened to Vf) having a ramp waveform and supplied from the ramp generator 1700. For example, when the reference voltage Vref is greater than a signal voltage Vx (see FIGS. 3A and 3B), an output of the comparator 100 may become a high (H) level. When the reference voltage Vref is less than the signal voltage Vx, the output of the comparator 100 may become a low (L) level. However, it is understood that one or more other exemplary embodiments are not limited thereto.

The memory 200 may store certain data. The data can be converted into the gain value gm of the trimmable transistor 10. Specifically, the N switches in the trimmable transistor 10 may be turned on or off in response to the data stored in the memory 200, thereby adjusting the gain value gm. The memory 200 may be a nonvolatile memory. For example, the memory 200 may be implemented as a dynamic random access memory (DRAM), a static random access memory (SRAM), a phase-change random access memory (PRAM), a ferroelectric random access memory (FRAM), a resistive random access memory (RRAM), and/or a magneto-resistive random access memory (MRAM). However, it is understood that one or more other exemplary embodiments are not limited thereto. Furthermore, according to another exemplary embodiment, the memory 200 can be replaced by a logic or controller that can change the gain value gm by controlling the N switches of the trimmable transistor 10.

The PLC 300 includes an up/down counter. That is, the PLC 300 may perform an UP count or a DOWN count in response to a control signal supplied from the timing generator 1800. In synchronization with a clock of the timing generator 1800, the PLC 300 may measure a comparison time from the initiation of the comparison operation of the comparator 100 to the termination of the comparison operation of the comparator 100.

For example, the PLC 300 may operate in a first frame rate mode or a high-speed frame rate mode. In the first frame rate mode, when a signal from one unit pixel 1510 is read, the PLC 300 may perform a DOWN count in a first read operation to measure the comparison time in the first read operation. In addition, the PLC 300 perform an UP count in a second read operation to measure the comparison time in the second read operation.

In the high-speed frame rate mode, the PLC 300 retains a count result for one row of unit pixels 1510. In a first read operation on a next row of unit pixels 1510, the PLC 300 decreases its count value from the previous count result to measure the comparison time in the first read operation. In addition, the PLC 300 increases its count value in a second read operation to measure the comparison time in the second read operation. However, it is understood that one or more other exemplary embodiments are not limited thereto.

Therefore, the PLC 300 according to the present exemplary embodiment automatically performs subtraction defined by (comparison time in second read operation)–(comparison time in first read operation). When the reference voltage Vref becomes equal to the pixel signal Vpixel of the vertical signal line 1515, the polarity of the output of the comparator 100 may be inverted. In this case, the PLC 300 may stop its count operation. As a result, the PLC 300 may retain the count value according to the result of subtraction defined by (comparison time in second read operation)–(comparison time in first read operation).

The two or more read operations and the subtraction operation of the PLC 300 can remove a reset component and an offset component included in each of the unit pixels 1510. Therefore, only a signal component may be extracted according to the amount of light incident upon each of the unit pixels 1510. Here, removing the reset component including a change from each of the unit pixels 1510 is referred to as correlated double sampling (CDS).

Each of the first memory 400 and the second memory 500 may store a binary count value (e.g., a binary code) obtained through the comparator 100 and the PLC 300. That is, an analog signal supplied from a unit pixel 1510 of the pixel array 1500 via a corresponding vertical signal line 1515 may be converted into an N-bit digital signal (where N is a natural number) by the operations of the comparator 100 and the PLC 300 of a corresponding ADC 1000, and the N-bit digital signal may be stored in each of the first memory 400 and the second memory 500.

Each of the first memory 400 and the second memory 500 may be a nonvolatile memory. For example, each of the first memory 400 and the second memory 500 may be implemented as, but not limited to, a DRAM, an SRAM, a PRAM, an FRAM, an RRAM, and/or an MRAM.

The precharge unit 1300 and the sense amplifier 1310 may amplify an output of each of the ADCs 1000. The precharge unit 1300 may be connected to the first memories 400 and the second memories 500 of the ADCs 1000 by horizontal output lines 1305. The precharge unit 1300 may receive an N-bit digital signal into which an analog signal has been converted by each of the ADCs 1000. The precharge unit 1300 may be connected to the sense amplifier 1310. The sense amplifier 1310 may receive values output from the first memories 400 and the second memories 500 through the precharge unit 1300 and amplify the received values.

The output buffer 1320 may be connected to the sense amplifier 1310. The output buffer 1320 may temporarily store a digital signal received from the sense amplifier 1310 before transmitting the digital signal to another device connected to the image sensor 2000. The output buffer 1320 may operate as an interface that compensates for a difference in transmission speed between the image sensor 2000 and the other device connected to the image sensor 2000, but it is understood that one or more other exemplary embodiments are not limited thereto.

The calibration circuit 1200 is connected to the memory 200 of each of the ADCs 1000 by the precharge unit 1300 and the sense amplifier 1310 and calibrates the gain value gm of each of the ADCs 1000. The calibration circuit 1200 may determine whether the slope of a ramp signal has changed and change the data stored in the memory 200 based on the determination result, thereby calibrating the gain value gm of the trimmable transistor 10, which will be described in detail below.

The column controller 1900 may receive control signals from the timing generator 1800 and control the column address and column scan of the pixel array 1500. The column controller 1900 may include a shift register, etc., and control the vertical signal lines 1515 connected to the ADCs 1000. The column controller 1900 may control N-bit digital signals, into which analog signals have been converted by the ADCs 1000, to be read in a predetermined order. The read digital signals may be output as image data via the horizontal output lines 1305 connected in parallel to the ADCs 1000.

The horizontal output lines 1305 may be connected in parallel to the first memory 400 and the second memory 500 of each of the ADCs 1000. The horizontal output lines 1305 may deliver image data to the precharge unit 1300.

The row controller 1600 may receive the control signals from the timing generator 1800 and control the row address and row scan of the pixel array 1500. The row controller 1600 may include a shift register, etc. The row controller 1600 may provide a pixel driving signal to the pixel array 1500. Depending on an exemplary embodiment, if the unit pixels 1510 of the pixel array 1500 are arranged in a matrix, the pixel driving signal may be provided to each row of the matrix. Specifically, the row controller 1600 may output an image signal of a certain row by controlling the row address and row scan of the pixel array 1500. The row controller 1600 may control outputs of the pixel array 1500 using the row control lines 1513, but it is understood that one or more other exemplary embodiments are not limited thereto.

The ramp generator 1700 may provide a ramp signal having a certain slope to the ADCs 1000. The ramp signal may include the coarse ramp signal Vc and the fine ramp signal Vf. The ramp signal serves as a basis for measuring the size of an image signal output from each pixel 1510 during analog-to-digital conversion.

The timing generator 1800 may control the ADCs 1000, the row controller 1600, the column controller 1900, and the ramp generator 1700. The timing generator 1800 may provide control signals for the operations of these elements, such as a clock signal and a timing control signal. Accordingly, the operations of the ADCs 1000 may be performed in each row scan period of the row controller 1600 for the pixel array 1500.

The timing generator 1800 may include, but not limited to, a logic control circuit, a phase lock loop (PLL), a timing control circuit, and a communication interface circuit.

Figure 2:
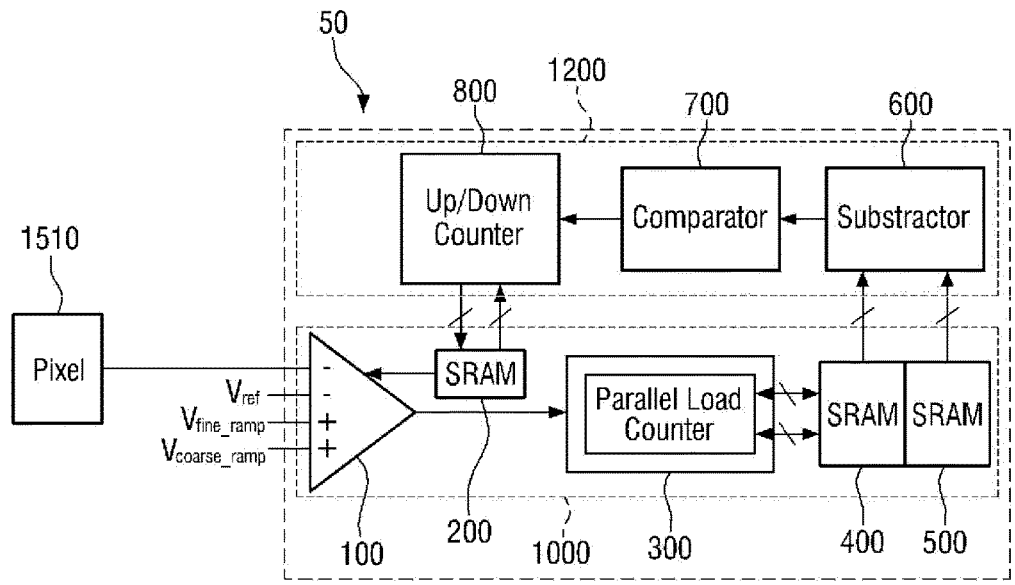
FIG. 2 is a block diagram of a ramp signal calibration apparatus according to an exemplary embodiment.
Figure 3A:
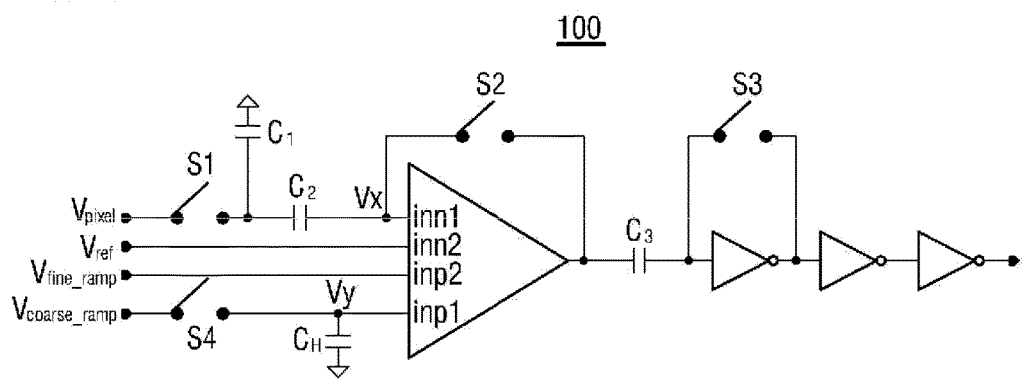
FIGS. 3A and 3B are block diagrams of comparators according to one or more exemplary embodiments.
Figure 3B:
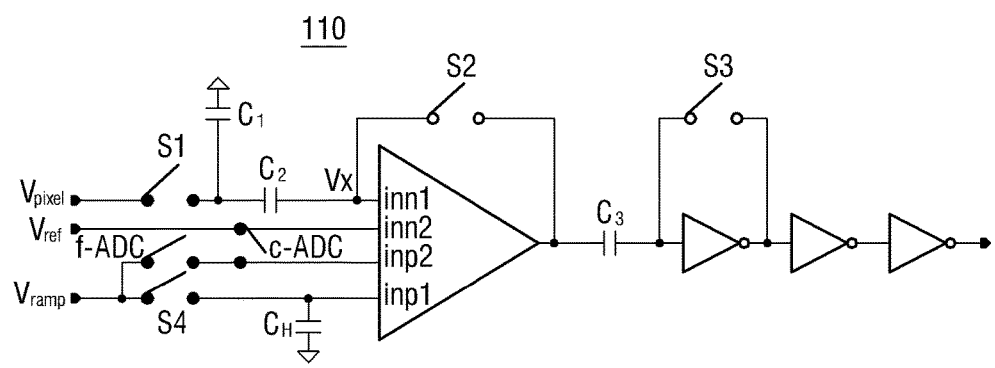

FIG. 2 is a block diagram of a ramp signal calibration apparatus 50 according to an exemplary embodiment. FIGS. 3A and 3B are block diagrams of comparators 100 and 110 according to one or more exemplary embodiments. FIGS.

Figure 5:
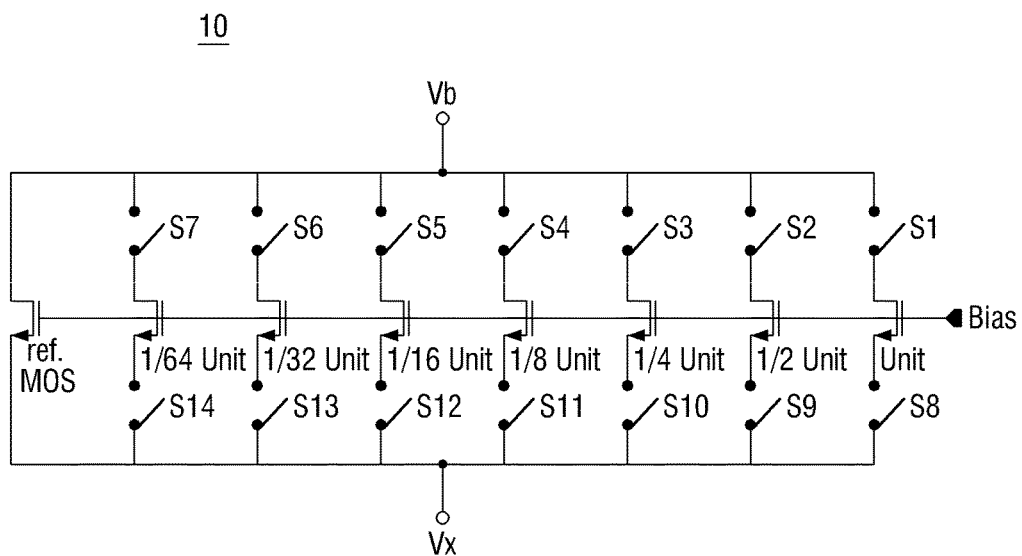
FIG. 5 is a circuit diagram of a trimmable transistor according to an exemplary embodiment.

4A through 4C are circuit diagrams of comparators 100, 102 and 104 according to one or more exemplary embodiments. FIG. 5 is a circuit diagram of a trimmable transistor 10 according to an exemplary embodiment. For simplicity, a redundant description of elements and features substantially identical or similar to those of the above-described exemplary embodiment will be omitted below, and the following exemplary embodiments will be described by focusing mainly on differences with the above-described exemplary embodiment.

Referring to FIG. 2, the ramp signal calibration apparatus 50 according to the present exemplary embodiment includes an ADC 1000 and a calibration circuit 1200. The ADC 1000 may include a comparator 100, a memory 200, a PLC 300, a first memory 400, and a second memory 500. The calibration circuit 1200 may include a subtractor 600, a digital comparator 700, and an up/down counter 800.

The ADC 1000 may operate as, but not limited to, a single slope analog-to-digital converter (SS ADC) or a two-step single slope analog-to-digital converter (TS SS ADC).

The comparator 100 may receive a pixel signal Vpixel of an image pixel 1510, a reference voltage Vref having a certain voltage level, and a coarse ramp signal Vc and/or a fine ramp signal Vf included in a ramp signal of the ramp generator 1700. The comparator 100 may receive and compare the pixel signal Vpixel and the ramp signal. The comparator 100 may include an amplifier, switches S1 through S4, and capacitors C1 through C3. The comparator 100 may be, but is not limited to, of a Gilbert-cell type 30 (see FIGS. 4A through 4C).

In FIG. 3A, the comparator 100 of an ADC 1000 according to an exemplary embodiment is illustrated.

Referring to FIG. 3A, an amplifier may receive a pixel signal Vpixel, which corresponds to an optical signal, a reference voltage Vref, and a fine ramp signal Vf and a coarse ramp signal Vc generated by the ramp generator 1700.

A switch S4 may be connected between a coarse ramp signal input terminal, which receives the coarse ramp signal Vc, and the amplifier.

A capacitor CH may have an end connected between the switch S4 and the amplifier and another end connected to a ground source.

Accordingly, when the switch S4 is turned on, the coarse ramp signal Vc may be transmitted directly to the amplifier. When the switch S4 is turned off, the coarse ramp signal Vc may be stored in the capacitor CH. Thus, the coarse ramp signal Vc may be held from being transmitted to the amplifier by operation of the switch S4. The comparator 100 may process information about each of a coarse analog-to-digital conversion section and a fine analog-to-digital conversion section. A signal output from the comparator 100 may be input to the PLC 300.

In FIG. 3B, the comparator 110 of an ADC 1000 according to another exemplary embodiment is illustrated.

Referring to FIG. 3B, one ramp signal Vramp generated by the ramp generator 1700 and a pixel signal Vpixel may be transmitted to the comparator 110. The comparator 110 may compare the ramp signal Vramp and the pixel signal Vpixel, so that coarse analog-to-digital conversion and fine analog-to-digital conversion can be performed at high speed by a capacitor CH and switches f-ADC and c-ADC.

Referring back to FIG. 2, the PLC 300 may perform an addition processing on a digital signal by measuring the comparison time from the initiation of the comparison operation of the comparator 100 to the termination of the comparison operation of the comparator 100 in synchronization with a clock of the timing generator 1800. Accordingly, an analog signal input to the comparator 100 can be converted into an N-bit digital signal.

Specifically, the PLC 300 is a code generator that outputs, as a digital code, an N-bit digital value at a time when a voltage level of an input signal becomes equal to a voltage level of the ramp signal. In response to a clock or a clock signal, the PLC 300 begins counting from when the ramp signal starts to ramp up and outputs an N-bit digital value as the count result. The PLC 300 may store count values corresponding to coarse analog-to-digital conversion section data and fine analog-to-digital conversion section data in the first memory 400 and the second memory 500, respectively. The ADC 1000 operating in this way is referred to as a TS SS ADC.

The TS SS ADC performs a coarse analog-to-digital conversion process on higher-order bits and a fine analog-to-digital conversion process on lower-order bits. Then the TS SS ADC performs analog-to-digital conversion on a combination of the higher-order bits and the lower-order bits.

For example, coarse analog-to-digital conversion may be performed on 7 bits, and fine analog-to-digital conversion may be performed on 7 bits. Consequently, the TS SS ADC may convert a total of 14 bits in the above case.

Therefore, if Tclk is 10 μs, an SS ADC requires a time of 163.84 μs in order to produce a resolution of 14 bits. On the other hand, the TS SS ADC additionally includes 1 digital correction logic (DCL) bit. Therefore, in theory, the TS SS ADC can produce a final result within 3.84 μs. Thus, an increase of approximately 42 times in speed can be expected. However, it is understood that one or more other exemplary embodiments are not limited thereto.

Figure 4A:
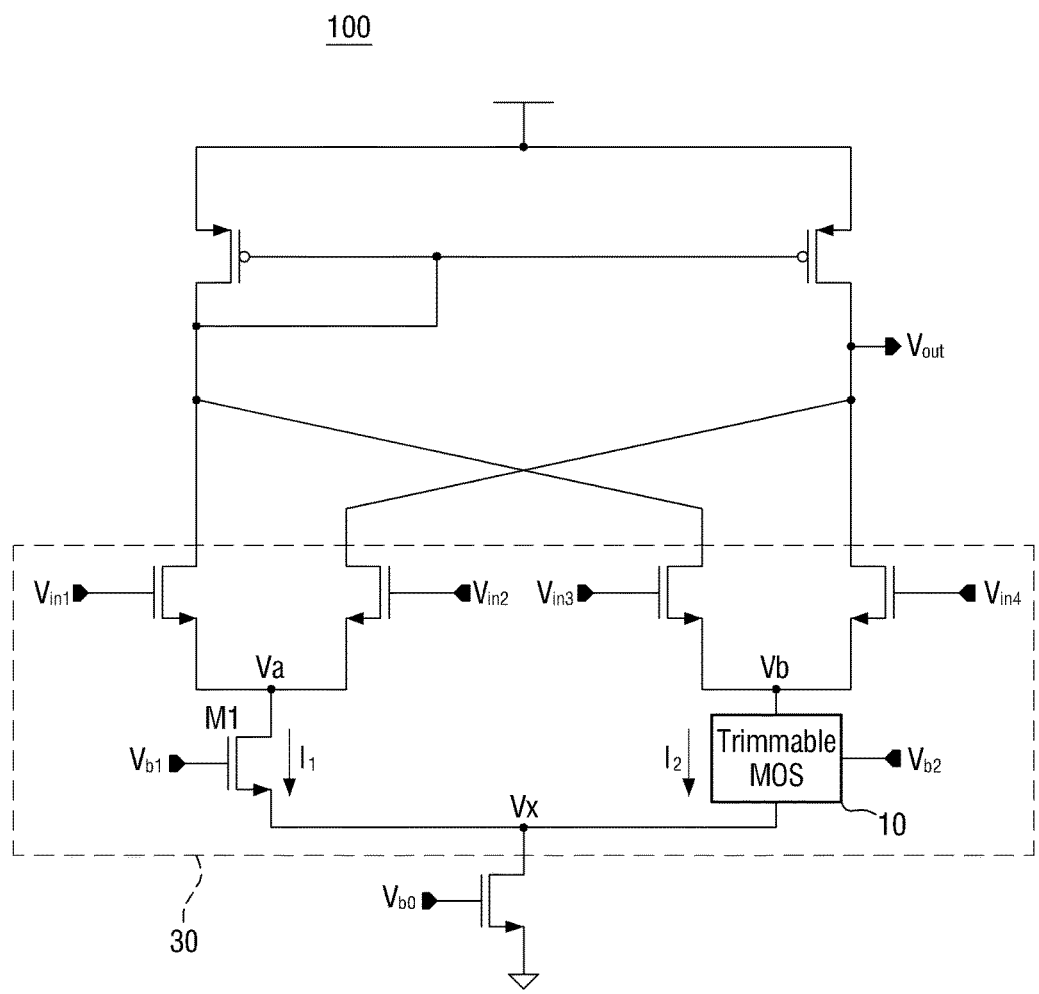
FIGS. 4A through 4C are circuit diagrams of comparators according to one or more exemplary embodiments.
Figure 4B:
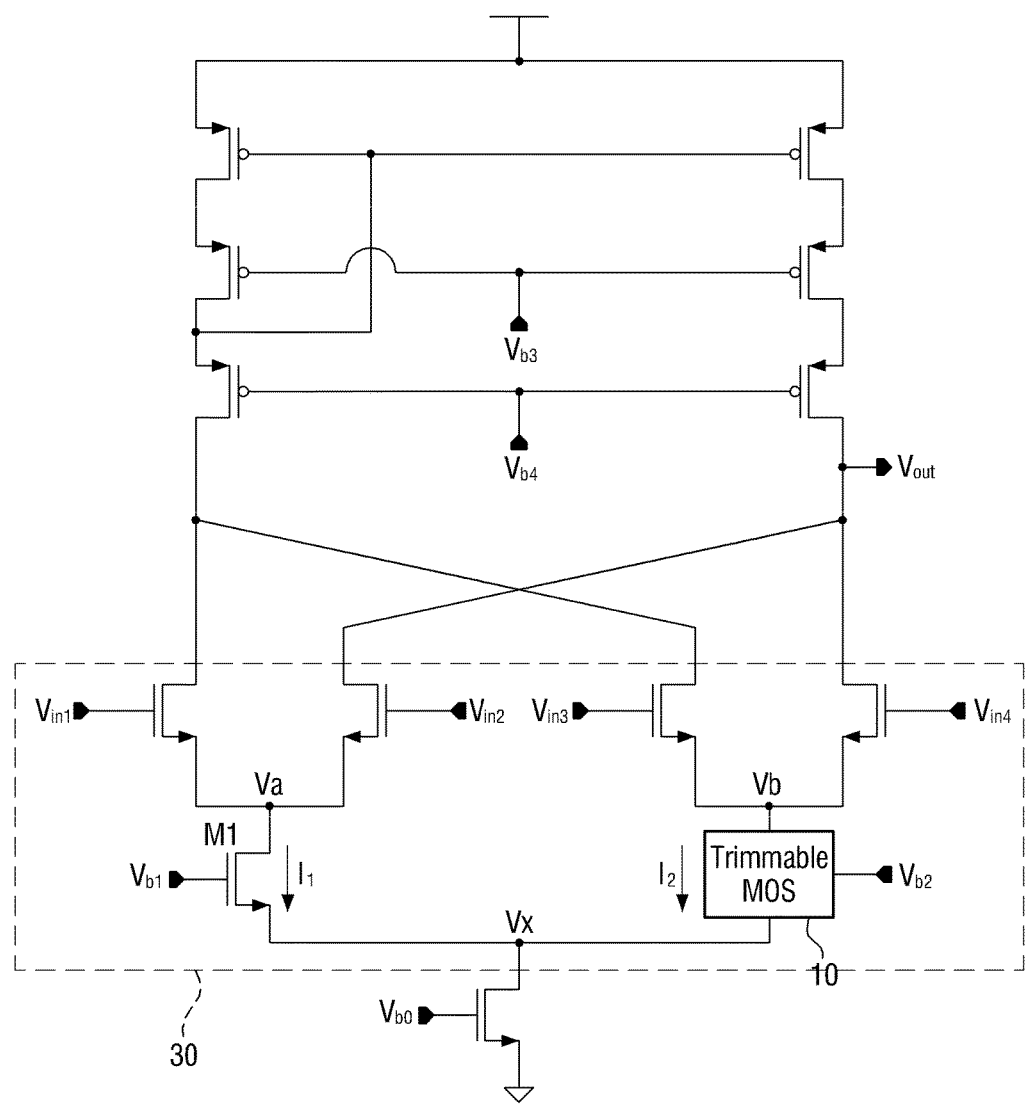
Figure 4C:
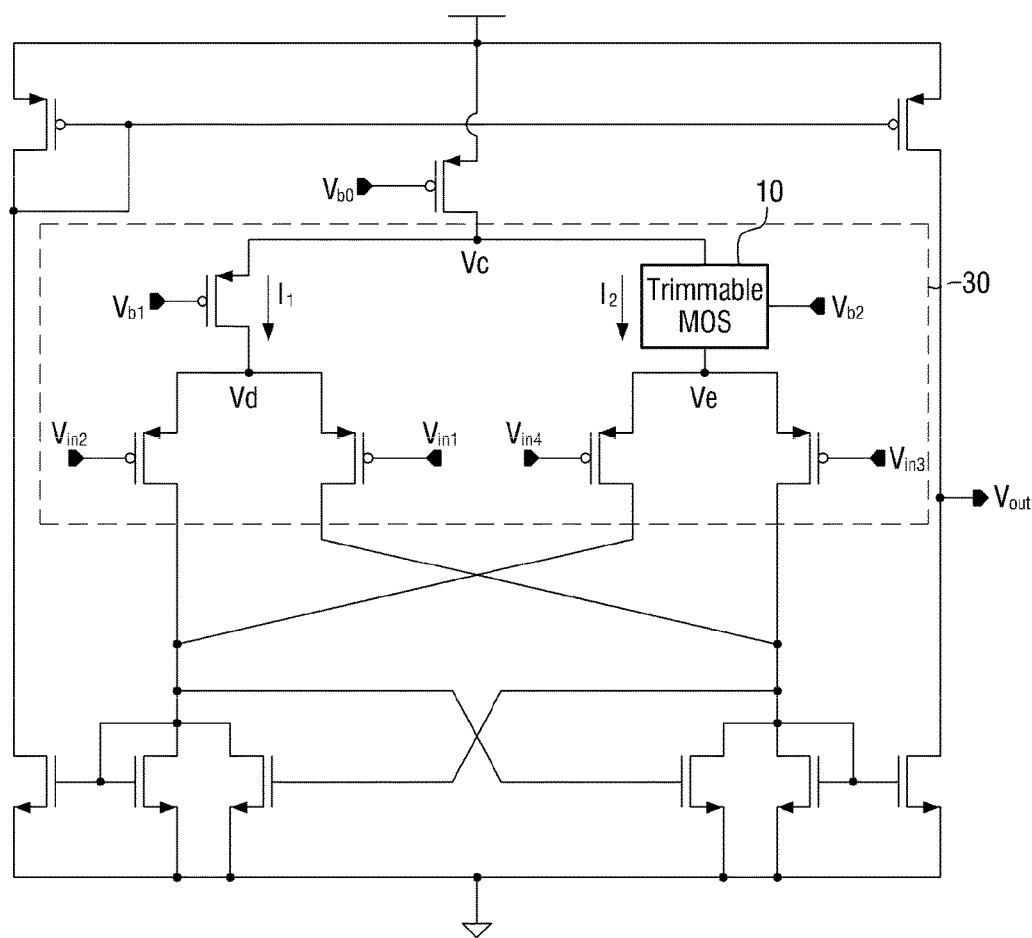

Referring to FIGS. 4A through 4C, the comparator 100 may be of a Gilbert-cell type 30 that receives four inputs, that is, a pixel signal Vpixel, a reference voltage Vref, a fine ramp signal Vf, and a coarse ramp signal Vc. The comparator 102 of FIG. 4B may perform substantially the same or similar operation as the comparator 100 of FIG. 4A. Likewise, the comparator 104 of FIG. 4C may perform substantially the same or similar operation as the comparator 100 of FIG. 4A. Output values of the comparators 100, 102, and 104 of FIGS. 4A through 4C can be calculated using Equation (1) below:

$$I_1 = \tfrac{1}{2}K(V_{b1}-V_x-V_{Tn})^2, I_2 = \tfrac{1}{2}K(V_{b2}-V_x-V_{Tn})^2, gm_1 = \sqrt{2 \cdot k \cdot I_1}, gm_2 = \sqrt{2 \cdot k \cdot I_2}$$
$$V_{out} = gm_1 \cdot R_o(V_{in1}-V_{in2}) + gm_2 \cdot R_o(V_{in3}-V_{in4}) \quad (1)$$

where I1 is an electric current flowing through a metal oxide semiconductor field effect transistor (MOSFET) M1, I2 is an electric current flowing through the trimmable transistor 10, Vin1 is a coarse ramp signal Vc, Vin2 is a pixel signal Vpixel, Vin3 is a fine ramp signal Vf, Vin4 is a reference voltage Vref, Vb1 and Vb2 are bias voltages respectively applied to both terminals, gm1 and gm2 are transconductance values of first and second MOSFETs, and Ro is an output impedance value.

In Equation (1), it is assumed that a bias is of an n-type Gilbert-cell type composed of an nMOS. If the bias is of a p-type Gilbert-cell type composed of a pMOS, Equation (1) may be changed accordingly. Equation (1) can be changed using a method widely known to those of ordinary skill in the art, and the method is not limited to a particular method.

FIG. 5 is a circuit diagram of the trimmable transistor 10 included in each of the comparators 100, 102, and 104, according to an exemplary embodiment.

Referring to FIG. 5, the trimmable transistor 10 may include a reference transistor Ref MOS, N MOS transistors, and N switches S1 through S7 connected in parallel. A Vb terminal may be connected to respective sides of the reference transistor Ref MOS and the N MOS transistors, and a Vx terminal may be connected to the other respective sides thereof. However, it is understood that one or more other exemplary embodiments are not limited thereto. For example, according to another exemplary embodiment, the trimmable transistor 10 included in the comparator 104 of FIG. 4C may have a side connected to a Vc terminal and the other side connected to a Vf terminal.

The same bias may be applied to a gate of the reference transistor Ref MOS and gates of the N MOS transistors. The bias may be a 'high' signal having a certain voltage.

A switch may be disposed on a side of each of the MOS transistors of the trimmable transistor 10. However, it is understood that one or more other exemplary embodiments are not limited thereto. For example, according to another exemplary embodiment, the switch may also be disposed on both sides of each of the MOS transistors. Two switches (e.g., S1 and S8) respectively connected to a source and a drain of each MOS transistor may be simultaneously turned on or off. That is, since a certain voltage is being applied to the gate terminal of each MOS transistor, when the switches are closed, an electric current may flow through the MOS transistors.

The gain value gm of the trimmable transistor 10 may vary according to data stored in the memory 200. The N switches Si through S7 may be turned on or off according to the data stored in the memory 200. For example, the data may be stored as a binary code of N bits, and the N bits may respectively correspond to the N MOS transistors. When the switches S1 through S7 are closed, the N MOS transistors may provide different amounts of current. For example, if a first MOS transistor Unit provides a unit current, a second MOS transistor ½ Unit may provide a ½ unit current, and a third MOS transistor ¼ Unit may provide a ¼ unit current. The N MOS transistors can be used in the calibration circuit 1200 having N-bit resolution, but it is understood that one or more other exemplary embodiments are not limited thereto. Unlike the MOS transistors, the reference transistor Ref MOS may not be connected to switches. Therefore, an electric current may always flow through the reference transistor Ref MOS.

The data stored in the memory 200 may have initial data. The initial data may be set such that the gain value gm of the trimmable transistor 10 has a median value. For example, when data is stored as a 7-bit binary code, the initial data may be a binary number of '1000000,' but it is understood that one or more other exemplary embodiments are not limited thereto.

The data stored in the memory 200 may be changed by the calibration circuit 1200. When the data stored in the memory 200 is changed, the positions of the N switches of the trimmable transistor 10 may change according to the changed data. Accordingly, the gain value gm of the trimmable transistor 10 may be changed from a first gain value gm1 to a second gain value gm2. The changed gain value gm may change the amount of electric current flowing through the trimmable transistor 10, thereby calibrating the slope of the ramp signal transmitted to the comparator 100, which will be described in detail below.

Referring back to FIG. 2, the calibration circuit 1200 may be connected to the ADC 1000. The calibration circuit 1200 may include the subtractor 600, the digital comparator 700, and the up/down counter 800. The ADC 1000 may include the comparator 100, the memory 200, the PLC 300, the first memory 400, and the second memory 500.

The operation of the ADC 1000 for converting an analog pixel signal Vpixel of an image pixel into a digital signal may be different from the operation of the ADC 1000 for calibrating a ramp signal using the calibration circuit 1200. For example, values stored in the first and second memories 400 and 500 in the analog-to-digital conversion of the ADC 1000 may be different from values stored in the first and second memories 400 and 500 in the ramp signal calibration of the ADC 1000. However, it is understood that one or more other exemplary embodiments are not limited thereto.

In the ramp signal calibration of the ADC 1000, the first memory 400 may store a first output signal, and the second memory 500 may store a second output signal. Specifically, the first output signal may include an output of the fine ramp signal Vf that corresponds to a first level of the coarse ramp signal Vc. The second output signal may include an output of the fine ramp signal Vf that corresponds to a second level of the coarse ramp signal Vc. A difference between the second level and the first level may correspond to a least significant bit (LSB) of the coarse ramp signal Vc. That is, the ADC 1000 may receive the fine ramp signal Vf corresponding to each of the first level and the second level and output the first and second output signals.

For example, a value (N bits+1 DCL bit) of the fine ramp signal Vf that corresponds to the first level of the coarse ramp signal Vc (i.e., a higher-order value in an LSB of the coarse ramp signal Vc) may be the first output signal, and a value (N bits+1 DCL bit) of the fine ramp signal Vf that corresponds to the second level of the coarse ramp signal Vc (i.e., a lower-order value in the LSB of the coarse ramp signal Vc) may be the second output signal. Therefore, the first level and the second level may be different from each other by, but not limited to, 1 LSB of the coarse ramp signal Vc.

The subtractor 600 may calculate a difference between the first output signal and the second output signal. That is, the subtractor 600 may calculate the difference between data stored in the first memory 400 and data stored in the second memory 500.

The digital comparator 700 may compare an output of the subtractor 600 with a reference value and determine whether the slope of the ramp signal has changed. Here, the output (the difference between the first output signal and the second output signal) of the subtractor 600 may indicate an output resolution of the ADC 1000, and the reference value may indicate a predetermined reference resolution of the ADC 1000. That is, the digital comparator 700 may determine whether a ratio of the slope of the fine ramp signal Vf and the slope of the coarse ramp signal Vc has changed by identifying whether a desired resolution of the fine analog-to-digital conversion section is equal to a value calculated by the subtractor 600.

The up/down counter 800 may change data stored in the memory 200 of the ADC 1000 according to whether the slope of the ramp signal has changed. The up/down counter 800 may increase or decrease its count value based on the determination result of the digital comparator 700.

When the output of the subtractor 600 is greater than the reference value, the up/down counter 800 may increase the gain value gm. When the output of the subtractor 600 is less than the reference value, the up/down counter 800 may decrease the gain value gm. When the output of the subtractor 600 is equal to the reference value, the data stored in the memory 200 may be maintained.

An increase or decrease of the count value may lead to an increase or decrease of the value of data stored in the memory 200. When the up/down counter 800 changes the data stored in the memory 200, the first gain value gm1 of the trimmable transistor 10 may be changed to the second gain value gm2 according to the changed data. However, it is understood that one or more other exemplary embodiments are not limited thereto.

That is, as the gain value gm of the trimmable transistor 10 increases or decreases, the amount of current flowing through the trimmable transistor 10 is adjusted. This can maintain the ratio of the slope of the fine ramp signal Vf and the slope of the coarse ramp signal Vc constant.

Figure 6:
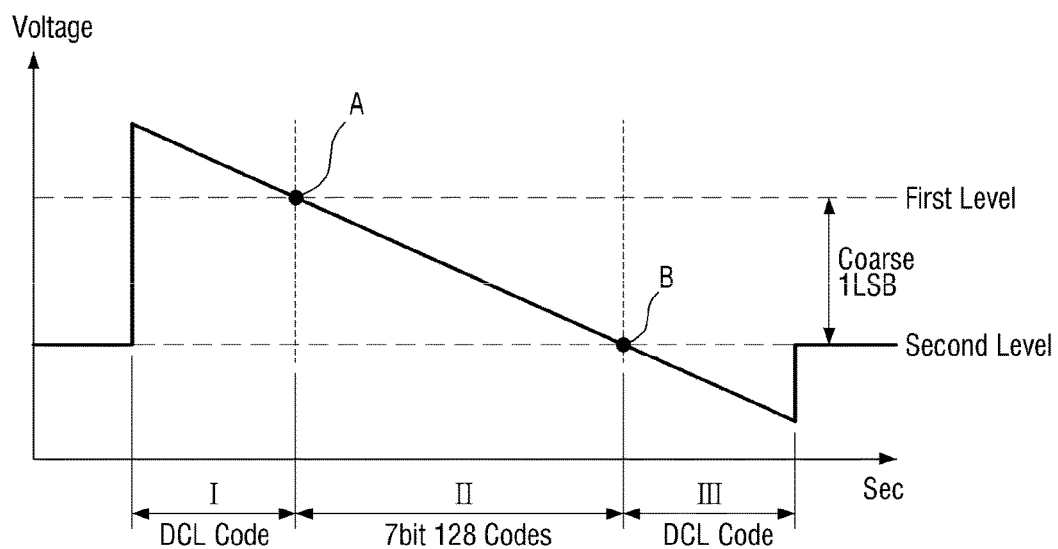
FIG. 6 is a diagram illustrating an analog gain in a normal state according to an exemplary embodiment.

FIG. 6 is a diagram illustrating an analog gain in a normal state according to an exemplary embodiment.

The graph of FIG. 6 illustrates an analog gain of a fine ramp signal Vf in a normal state. The x axis of the graph represents time, and the y axis of the graph represents voltage.

In a first section I and a third section III, DCL codes may be generated to reduce a dead band.

A second section II corresponds to an analog-to-digital conversion section of the fine ramp signal Vf. Fine code A may be generated at a point A where a first level of a coarse ramp signal Vc meets the fine ramp signal Vf, and fine code B may be generated at a point B where a second level of the coarse ramp signal Vc meets the fine ramp signal Vf. The second section II may extend from the point A where the first level of the coarse ramp signal Vc meets the fine ramp signal Vf to the point B where the second level of the coarse ramp signal Vc meets the fine ramp signal Vf. A difference between the second level and the first level may correspond to 1 LSB of the coarse ramp signal Vc.

A difference between the fine code A and the fine code B indicates a slope. A ramp signal includes the fine ramp signal Vf and the coarse ramp signal Vc. The slope of the coarse ramp signal Vc may not be easily changed, while the slope of the fine ramp signal Vf may be easily changed by external noise or a change in electric current. For example, in the normal state, the fine ramp signal Vf of 7 bits may generate a total of 128 codes. When the fine ramp signal Vf is in the normal state, a ratio of the slope of the coarse ramp signal Vc and the slope of the fine ramp signal Vf may be constant.

Figure 7A:
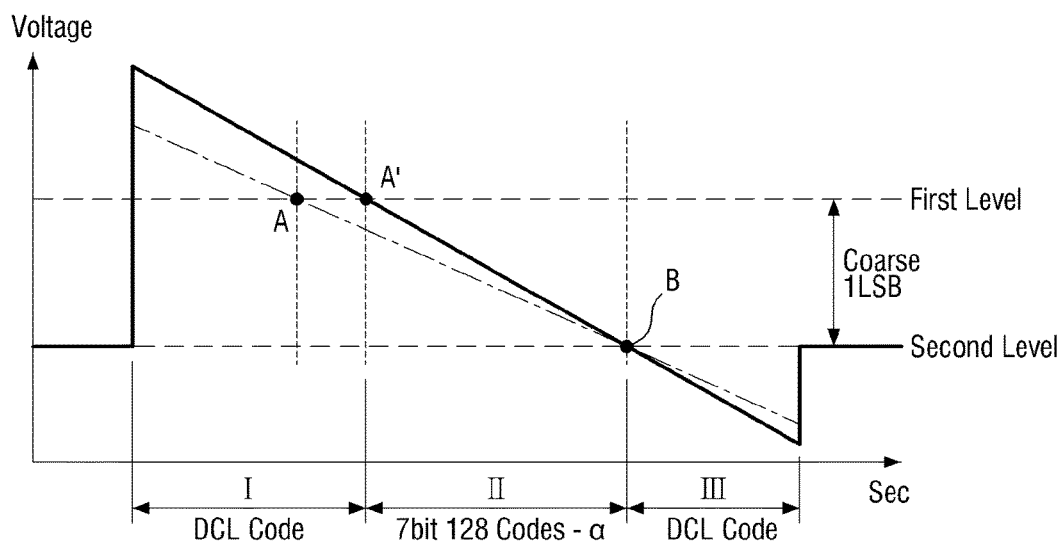
FIG. 7A is a diagram illustrating an analog gain in a state where the slope of a fine ramp signal has increased according to an exemplary embodiment.
Figure 7B:
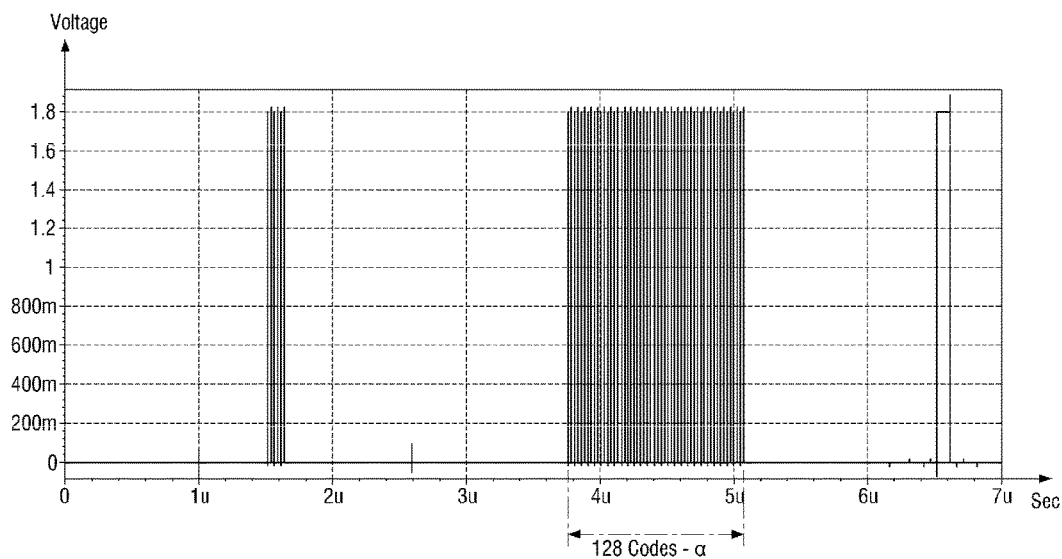
FIG. 7B is a diagram illustrating the number of output codes in the state where the slope of the fine ramp signal has increased according to an exemplary embodiment.
Figure 7C:
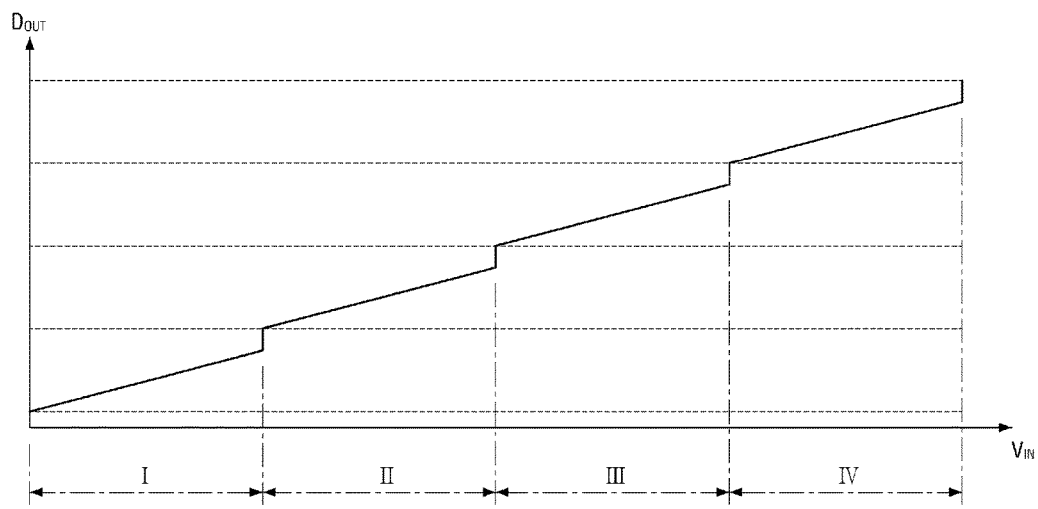
FIG. 7C is a diagram illustrating characteristics of an analog-to-digital converter (ADC) in the state where the slope of the fine ramp signal has increased according to an exemplary embodiment.

FIG. 7A is a diagram illustrating an analog gain in a state where the slope of the fine ramp signal Vf has increased according to an exemplary embodiment. FIG. 7B is a diagram illustrating the number of output codes in the state where the slope of the fine ramp signal Vf has increased according to an exemplary embodiment. FIG. 7C is a diagram illustrating characteristics of an ADC 1000 in the state where the slope of the fine ramp signal Vf has increased according to an exemplary embodiment. For simplicity, a redundant description of elements and features substantially identical or similar to those of the above-described exemplary embodiments will be omitted below, and the following exemplary embodiments will be described, focusing mainly on differences with the above-described exemplary embodiments.

In the graph of FIG. 7A, a dotted line represents the analog gain of the fine ramp signal Vf in the normal state described above with reference to FIG. 6, and a solid line represents an analog gain of the fine ramp signal Vf having an increased slope. The x axis of the graph represents time, and the y axis of the graph represents voltage.

A difference between fine code A' and fine code B indicates the slope of the fine ramp signal Vf. When the slope of the fine ramp signal Vf increases to be greater than the slope of the fine ramp signal Vf in the normal state, a point A' where the first level of the coarse ramp signal Vc meets the fine ramp signal Vf may be located after the point A in the normal state. Accordingly, the second section II may become shorter than in the normal state, which, in turn, reduces the number of fine ramp signals Vf generated. For example, when the slope of the fine ramp signal Vf increases, the fine ramp signal Vf of 7 bits may generate $(128-\alpha)$ codes, where a is a natural number.

In FIG. 7B, a total number of digital codes generated in the analog-to-digital conversion section of the fine ramp signal Vf is illustrated. When the slope of the fine ramp signal Vf increases, the fine ramp signal Vf of 7 bits may generate $(128-\alpha)$ codes, where $\alpha$ is a natural number. In this case, the resolution of a digital output of the ADC 1000 may be different from that in the normal state.

The graph of FIG. 7C illustrates the digital output of the ADC 1000 in a case where a linear voltage is applied to the ADC 1000. The x axis of the graph represents input voltage, and the y axis of the graph represents digital output.

In the normal state, since a linear voltage of the ramp signal is applied to the ADC 1000, the digital output of the ADC 1000 should also have linearity. However, as the slope of the fine ramp signal Vf increases, the number of codes of the fine ramp signal Vf output in each section becomes greater than that in the normal state. As a result, the linearity of the digital output may be reduced as illustrated in FIG. 7C.

Figure 8A:
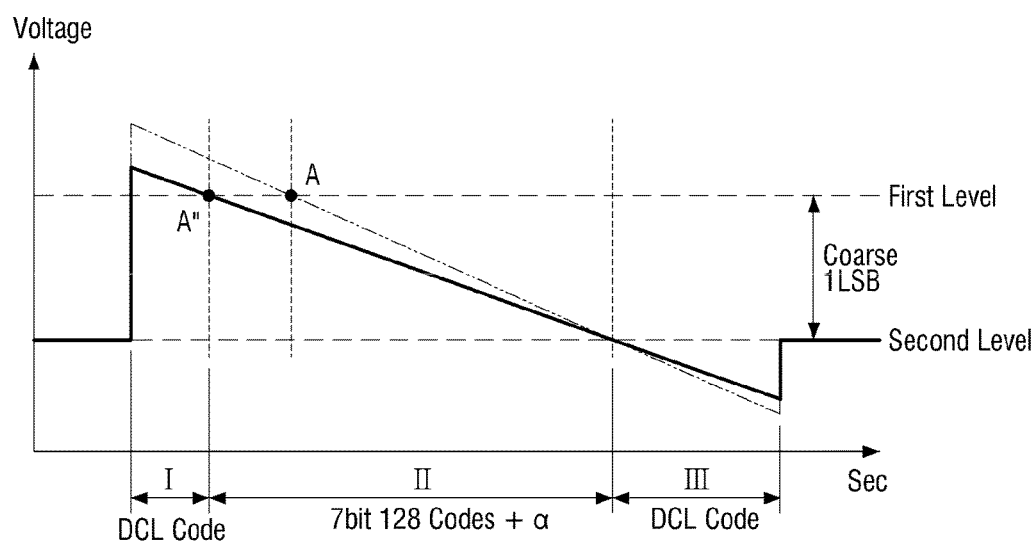
FIG. 8A is a diagram illustrating an analog gain in a state where the slope of the fine ramp signal has decreased according to an exemplary embodiment.
Figure 8B:
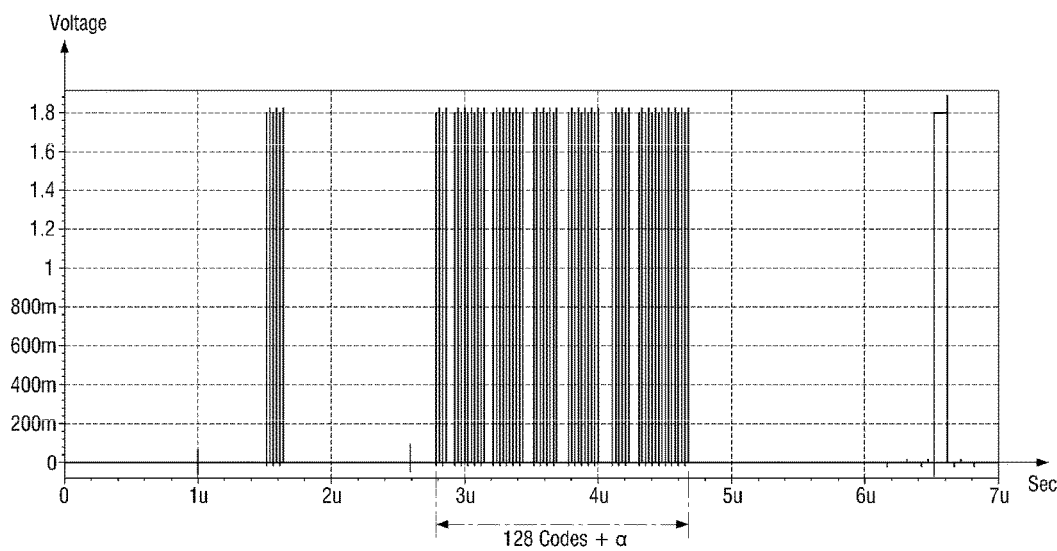
FIG. 8B is a diagram illustrating the number of output codes in the state where the slope of the fine ramp signal has decreased according to an exemplary embodiment.
Figure 8C:
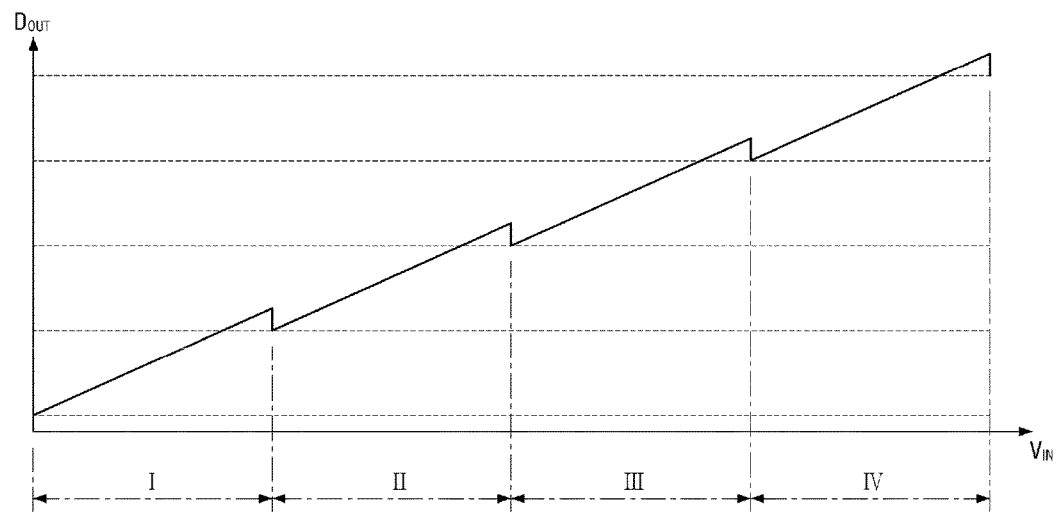
FIG. 8C is a diagram illustrating characteristics of the ADC in the state where the slope of the fine ramp signal has decreased according to an exemplary embodiment.

FIG. 8A is a diagram illustrating an analog gain in a state where the slope of the fine ramp signal Vf has decreased according to an exemplary embodiment. FIG. 8B is a diagram illustrating the number of output codes in the state where the slope of the fine ramp signal Vf has decreased according to an exemplary embodiment. FIG. 8C is a diagram illustrating characteristics of the ADC 1000 in the state where the slope of the fine ramp signal Vf has decreased according to an exemplary embodiment. For simplicity, a redundant description of elements and features substantially identical or similar to those of the above-described exemplary embodiments will be omitted below, and the following exemplary embodiments will be described, focusing mainly on differences with the above-described exemplary embodiments.

In the graph of FIG. 8A, a dotted line represents the analog gain of the fine ramp signal Vf in the normal state described above with reference to FIG. 6, and a solid line represents an analog gain of the fine ramp signal Vf having a reduced slope. The x axis of the graph represents time, and the y axis of the graph represents voltage.

A difference between fine code A" and fine code B indicates the slope of the fine ramp signal Vf. When the slope of the fine ramp signal Vf decreases to be less than the slope of the fine ramp signal Vf in the normal state, a point A" where the first level of the coarse ramp signal Vc meets the fine ramp signal Vf may be located before the point A in the normal state. Accordingly, the second section II may become longer than in the normal state, which, in turn, increases the number of fine ramp signals Vf generated. For example, when the slope of the fine ramp signal Vf decreases, the fine ramp signal Vf of 7 bits may generate $(128+\alpha)$ codes, where $\alpha$ is a natural number.

In FIG. 8B, a total number of digital codes generated in the analog-to-digital conversion section of the fine ramp signal Vf is illustrated. When the slope of the fine ramp signal Vf decreases, the fine ramp signal Vf of 7 bits may generate $(128+\alpha)$ codes, where $\alpha$ is a natural number. In this case, the resolution of the digital output of the ADC 1000 may be different from that in the normal state.

The graph of FIG. 8C illustrates the digital output of the ADC 1000 in a case where a linear voltage is applied to the ADC 1000. The x axis of the graph represents input voltage, and the y axis of the graph represents digital output.

In the normal state, since a linear voltage of the ramp signal is applied to the ADC 1000, the digital output of the ADC 1000 should also have linearity. However, as the slope of the fine ramp signal Vf decreases, the number of codes of the fine ramp signal Vf output in each section becomes greater than that in the normal state. As a result, the linearity of the digital output may be reduced as illustrated in FIG. 8C.

When the slope of the fine ramp signal Vf increases or decreases as described above, a ratio of the slope of the coarse ramp signal Vc and the slope of the fine ramp signal Vf should be maintained constant by calibrating the slope of the ramp signal. The problem of the changing slope of the fine ramp signal Vf may occur in each column of the image sensor 2000. Therefore, the calibration circuit 1200 according to an exemplary embodiment is able to maintain the output of each ADC 1000 in the normal state by calibrating the slope of the fine ramp signal Vf for the ADC 1000 in each column.

An operation of the calibration circuit 1200 for maintaining a ratio of the slope of the ramp signal constant, according to various exemplary embodiments, will now be described in more detail with reference to FIGS. 9 through 14.

Figure 9:
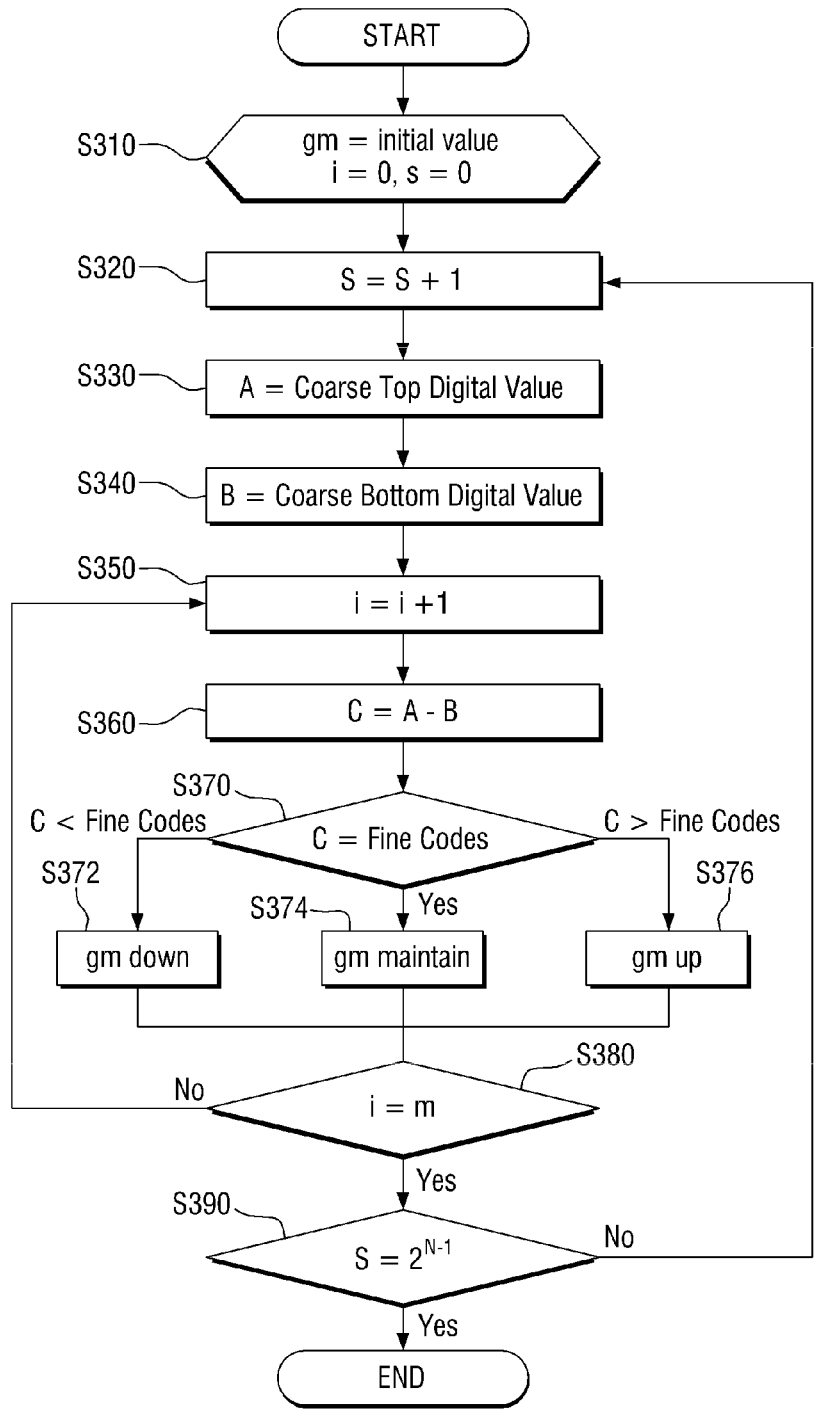
FIG. 9 is a flowchart illustrating a ramp signal calibration method according to an embodiment.
Figure 10:
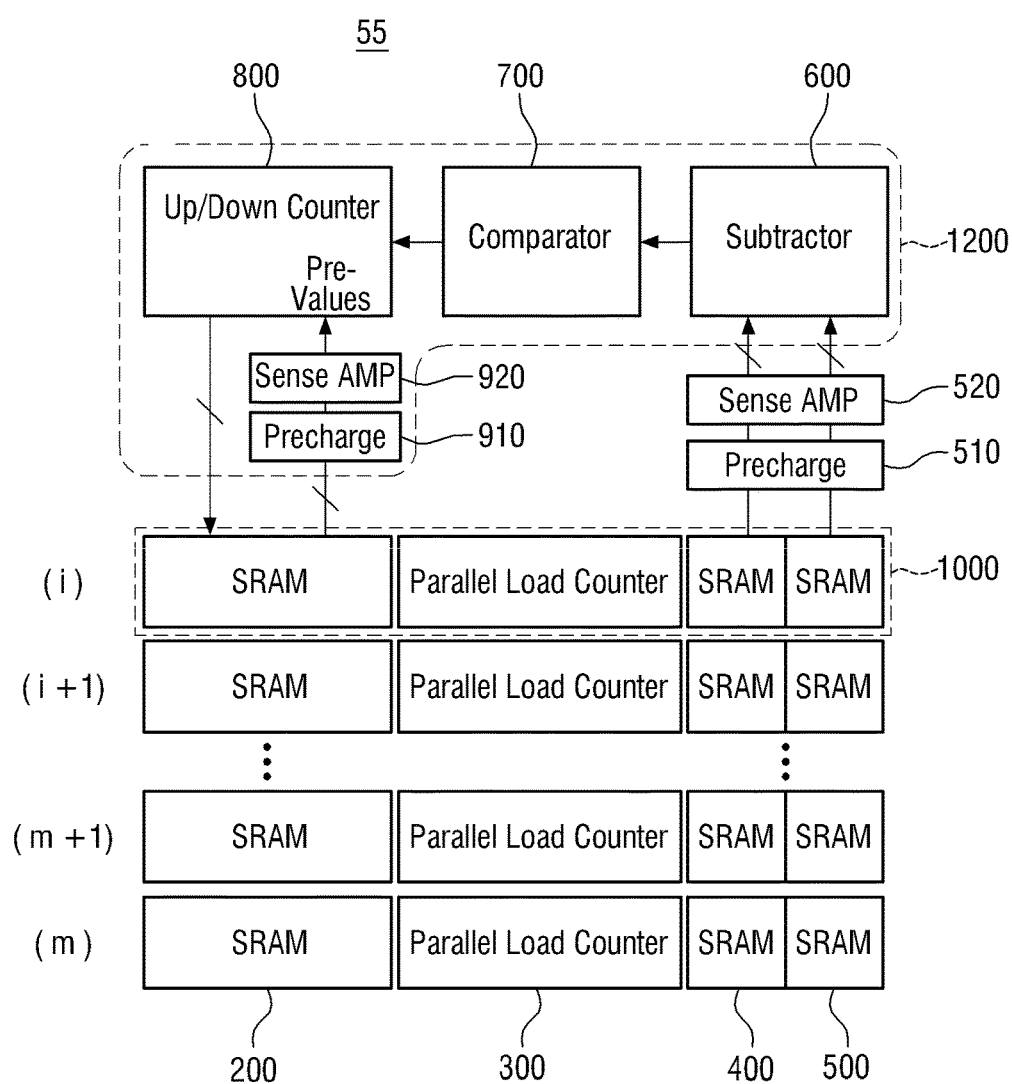
FIG. 10 is a block diagram of a ramp signal calibration apparatus according to another exemplary embodiment.
Figure 11:
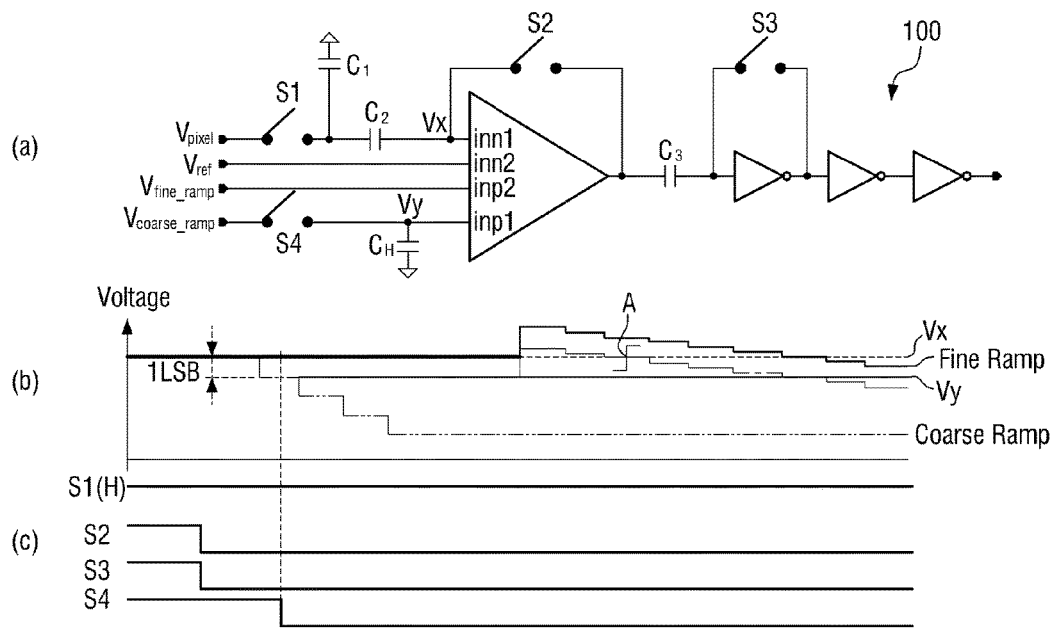
FIG. 11 is a diagram illustrating a method of sampling a highest-order bit from a least significant bit (LSB) of a coarse ramp signal according to an exemplary embodiment.
Figure 12:
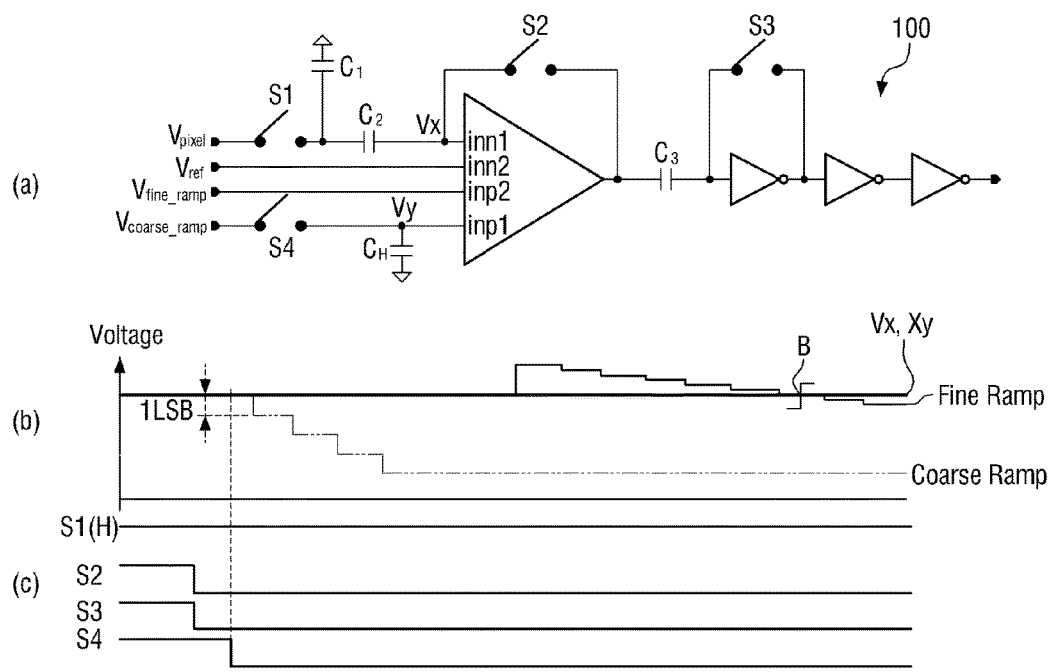
FIG. 12 is a diagram illustrating a method of sampling a lowest-order bit from the LSB of the coarse ramp signal according to an exemplary embodiment.

FIG. 9 is a flowchart illustrating a ramp signal calibration method according to an exemplary embodiment. FIG. 10 is a block diagram of a ramp signal calibration apparatus 55 according to another exemplary embodiment. FIG. 11 is a diagram illustrating a method of sampling a highest-order bit from an LSB of a coarse ramp signal Vc according to an exemplary embodiment. FIG. 12 is a diagram illustrating a method of sampling a lowest-order bit from the LSB of the coarse ramp signal Vc according to an exemplary embodiment. For simplicity, a redundant description of elements and features substantially identical or similar to those of the above-described exemplary embodiments will be omitted below, and the following exemplary embodiments will be described, focusing mainly on differences with the above-described exemplary embodiments.

Referring to FIG. 10, the ramp signal calibration apparatus 55 according to the present exemplary embodiment may be substantially the same as or similar to the ramp signal calibration apparatus 50 described above with reference to FIG. 2. The ramp signal calibration apparatus 55 may include a plurality of ADCs 1000, and the ADCs 1000 (i.e., $i^{th}$ through $m^{th}$ ADCs) may respectively be connected to a plurality of columns. The ADCs 1000 may be substantially the same as or similar to the ADC 1000 described above with reference to FIG. 2.

The ramp signal calibration apparatus 55 may include a precharge unit 510 (e.g., precharger) and a sense amplifier 520 that connect the ADCs 1000 to a calibration circuit 1200.

The precharge unit 510 and the sense amplifier 520 may amplify outputs of the ADCs 1000. The precharge unit 510 may be connected in parallel to a first memory 400 and a second memory 500 of each of the ADCs 1000. The precharge unit 510 may receive an N-bit digital signal into which an analog signal has been converted by each of the ADCs 1000. The precharge unit 510 may be connected to the sense amplifier 520. The sense amplifier 520 may receive values output from the first memory 400 and the second memory 500 through the precharge unit 510 and amplify the received values. The sense amplifier 520 may send amplified digital signals to the calibration circuit 1200, but it is understood that one or more other exemplary embodiments are not limited thereto.

The calibration circuit 1200 may also include a precharge unit 910 (e.g., precharger) and a sense amplifier 920. The precharge unit 910 of the calibration circuit 1200 may be substantially the same as or similar to the precharge unit 510 described above. The sense amplifier 920 of the calibration circuit 1200 may also be substantially the same as or similar to the sense amplifier 520 described above.

The precharge unit 910 and the sense amplifier 920 included in the calibration circuit 1200 may be connected to a memory 200 included in each of the ADCs 1000. The calibration circuit 1200 may load data stored in the memory 200 of each of the ADCs 1000. The precharge unit 910 and the sense amplifier 920 may be connected in parallel to the memories 200 and amplify respective outputs of the memories 200. Initial data may be stored in the memory 200 of each of the ADCs 1000. The initial data may be set such that a gain value gm of a trimmable transistor 10 included in each of the ADCs 1000 has a median value, but it is understood that one or more other exemplary embodiments are not limited thereto.

An up/down counter 800 of the calibration circuit 1200 may change data stored in the memory 200 of each of the ADCs 1000 according to whether the slope of a ramp signal has changed. The data may be stored as a binary code of N bits, which respectively correspond to N MOS transistors included in the trimmable transistor 10.

Specifically, the up/down counter 800 may retrieve data from the memory 200 through the precharge unit 910 and the sense amplifier 920 and increase or decrease the retrieved data according to whether the slope of the ramp signal has changed. For example, the up/down counter 800 may increase or decrease the data by one bit in each calibration operation, but it is understood that one or more other exemplary embodiments are not limited thereto. The changed data may be overwritten again to the memory 200.

Referring to FIGS. 9 and 10, in the ramp signal calibration method according to the present exemplary embodiment, the gain value gm of the trimmable transistor 10 included in each of the ADCs 1000 is initialized (operation S310). Each of the ADCs 1000 can control an electric current at an input terminal by adjusting the gain value gm of the trimmable transistor 10, thereby calibrating the slope of the ramp signal. In addition, the number S of calibration operations and the number i of calibrated ADCs 1000 may be initialized.

Next, one is added to the number S of calibration operations (operation S320).

Referring to FIGS. 9 and 11, a first output signal A is obtained by sampling a higher level (a first level) of the LSB of the coarse ramp signal Vc input to the ADCs 1000 and is stored in the first memory 400 included in each of the ADCs 1000 (operation S330). Here, signals are transmitted simultaneously to the ADCs 1000, so that all of the ADCs 1000 can simultaneously store the first output signal in their first memories 400.

Specifically, referring to FIG. 11, a comparator illustrated in (a) of FIG. 11 may be substantially the same as or similar to, but not limited to, the comparator 100 described above with reference to FIG. 3A. The graph in (b) of FIG. 11 illustrates Vx and Vy of the comparator 100, the coarse ramp signal Vc, and a fine ramp signal Vf. The graph in (c) of FIG. 11 illustrates signals transmitted to switches S1 through S4 of the comparator 100. An N-bit binary code may be allocated to each level of the coarse ramp signal Vc and each level of the fine ramp signal Vf, and the number of binary codes may be increased or decreased, but it is understood that one or more other exemplary embodiments are not limited thereto.

A value (N bits+1 DCL bit) of the fine ramp signal Vf which corresponds to Vx and Vy corresponding to the higher level (the first level) of the LSB of the coarse ramp signal Vc may be obtained. The value of the fine ramp signal Vf that corresponds to the first level may be a first output signal obtained by lowering the fine ramp signal Vf by 1 LSB (as represented by a dotted line of the fine ramp signal Vf) and then sampling the fine ramp signal Vf that corresponds to a point A where Vx meets the fine ramp signal Vf. The first output signal corresponds to an output of the fine ramp signal Vf that corresponds to the first level of the coarse ramp signal Vc. The first output signal may be fine code A of (N+1) bits. The first output signal may be stored in the first memory 400 of each of the ADCs 1000, but it is understood that one or more other exemplary embodiments are not limited thereto.

Referring to FIGS. 9 and 12, a second output signal B is obtained by sampling a lower level (a second level) of the LSB of the coarse ramp signal Vc input to the ADCs 1000 and is stored in the second memory 500 included in each of the ADCs 1000 (operation S340). Here, signals are transmitted simultaneously to the ADCs 1000, so that all of the ADCs 1000 can simultaneously store the second output signal in their second memories 500. Likewise, an N-bit binary code may be allocated to each level of the coarse ramp signal Vc and each level of the fine ramp signal Vf, and the number of binary codes may be increased or decreased, but it is understood that one or more other exemplary embodiments are not limited thereto.

Specifically, referring to FIG. 12, a comparator illustrated in (a) of FIG. 12 may be substantially the same as or similar to, but not limited to, the comparator 100 described above with reference to FIG. 3A. The graph in (b) of FIG. 12 illustrates Vx and Vy of the comparator 100, the coarse ramp signal Vc, and the fine ramp signal Vf. The graph in (c) of FIG. 12 illustrates signals transmitted to switches S1 through S4 of the comparator 100.

A value (N bits+1 DCL bit) of the fine ramp signal Vf that corresponds to Vx and Vy corresponding to the lower level (the second level) of the LSB of the coarse ramp signal Vc may be obtained. A difference between the second level and the first level may correspond to 1 LSB of the coarse ramp signal Vc. The value of the fine ramp signal Vf that corresponds to the second level may be a second output signal obtained by sampling the fine ramp signal Vf that corresponds to a point B where Vx meets the fine ramp signal Vf. The second output signal corresponds to an output of the fine ramp signal Vf that corresponds to the second level of the coarse ramp signal Vc. The second output signal may be fine code B of (N+1) bits. The second output signal may be stored in the second memory 500 of each of the ADCs 1000, but it is understood that one or more other exemplary embodiments are not limited thereto.

Next, one is added to the number i of calibrated ADCs 1000 (operation S350).

Then, the subtractor 600 calculates a difference (C) between the first output signal (A) stored in the first memory 400 and the second output signal (B) stored in the second memory 500 (operation S360). The subtractor 600 may receive outputs amplified by the precharge unit 510 and the sense amplifier 520. The subtractor 600 may be connected to the digital comparator 700 and may send the calculation result to the digital comparator 700.

The digital comparator 700 determines whether the slope of the ramp signal input to each of the ADCs 1000 has changed by comparing an output of the subtractor 600 with a reference value (operation S370). The output (the difference between the first output signal and the second output signal) of the subtractor 600 indicates an output resolution of each of the ADCs 1000, and the reference value indicates a predetermined reference resolution (the number of fine codes in a normal state) of each of the ADCs 1000. That is, the digital comparator 700 may determine whether a ratio of the slope of the fine ramp signal Vf and the slope of the coarse ramp signal Vc has changed by identifying whether a desired resolution of a fine analog-to-digital conversion section is equal to a value calculated by the subtractor 600.

When the output of the subtractor 600 is greater than the reference value, the up/down counter 800 may increase the value of data stored in the memory 200 (operation S372). Specifically, the up/down counter 800 may retrieve the data from the memory 200 through the precharge unit 910 and the sense amplifier 920 and then decrease the value of the retrieved data. Then, the up/down counter 800 overwrites the changed data again to the memory 200. Accordingly, a first gain value gm1 of the trimmable transistor 10 may be changed to a second gain value gm2 lower than the first gain value gm1.

When the output of the subtractor 600 is equal to the reference value, the up/down counter 800 maintains the value of the data stored in the memory 200 (operation S374). Accordingly, the first gain value gm1 of the trimmable transistor 10 can be maintained.

When the output of the subtractor 600 is less than the reference value, the up/down counter 800 reduces the value of the data stored in the memory 200 (operation S376). Specifically, the up/down counter 800 may retrieve the data from the memory 200 through the precharge unit 910 and the sense amplifier 920 and then increase the value of the retrieved data. Then, the up/down counter 800 overwrites the changed data again to the memory 200. Accordingly, a first gain value gm1 of the trimmable transistor 10 may be changed to a second gain value gm2 higher than the first gain value gm1.

That is, since a decrease in the slope of the ramp signal increases the count value, the up/down counter 800 decreases the count value by adjusting the gain value gm of the trimmable transistor 10. In addition, since an increase in the slope of the ramp signal decreases the count value, the up/down counter 800 increases the count value by adjusting the gain value gm of the trimmable transistor 10.

For example, when designing a 14-bit TS SS ADC, a designer may set the resolution of each conversion section by allocating 7 bits to a coarse analog-to-digital conversion section and 7 bits to a fine analog-to-digital conversion section in order for analog-to-digital conversion, although it is understood that one or more other exemplary embodiments are not limited thereto. Here, the calibration circuit 1200 maintains the slope of the ramp signal constant in the coarse analog-to-digital conversion section and the fine analog-to-digital conversion section, thereby maintaining an output of each of the ADCs 1000 in the normal state.

Next, it is determined whether the number i of calibrated ADCs 1000 is equal to a total number m of the ADCs 1000 (operation S380). That is, operations S360 through S378 may be performed on all of the ADCs 1000 one by one. The calibration circuit 1200 may calibrate the gain values gm of the ADCs 1000 in a predetermined order. For example, the calibration circuit 1200 may calibrate the gain values gm of the ADCs 1000 in an order in which the vertical signal lines 1515 of the pixel array 1500 are read, but it is understood that one or more other exemplary embodiments are not limited thereto.

It is determined whether the number S of calibration operations is equal to $2^{(N-1)}$ (operation S390). Here, N indicates the resolution of the calibration circuit 1200. For example, when a calibration circuit having 7-bit resolution is employed, 64 calibration operations may be performed for all of the ADCs 1000, but it is understood that one or more other exemplary embodiments are not limited thereto.

When it is determined in operation S380 that the number i of calibrated ADCs 1000 is less than the total number m of ADCs 1000, operations S360 through S378 may be performed again.

When it is determined in operation S390 that the number S of calibration operations is not equal to $2^{(N-1)}$, operations S320 through S380 may be performed again.

Figure 13:
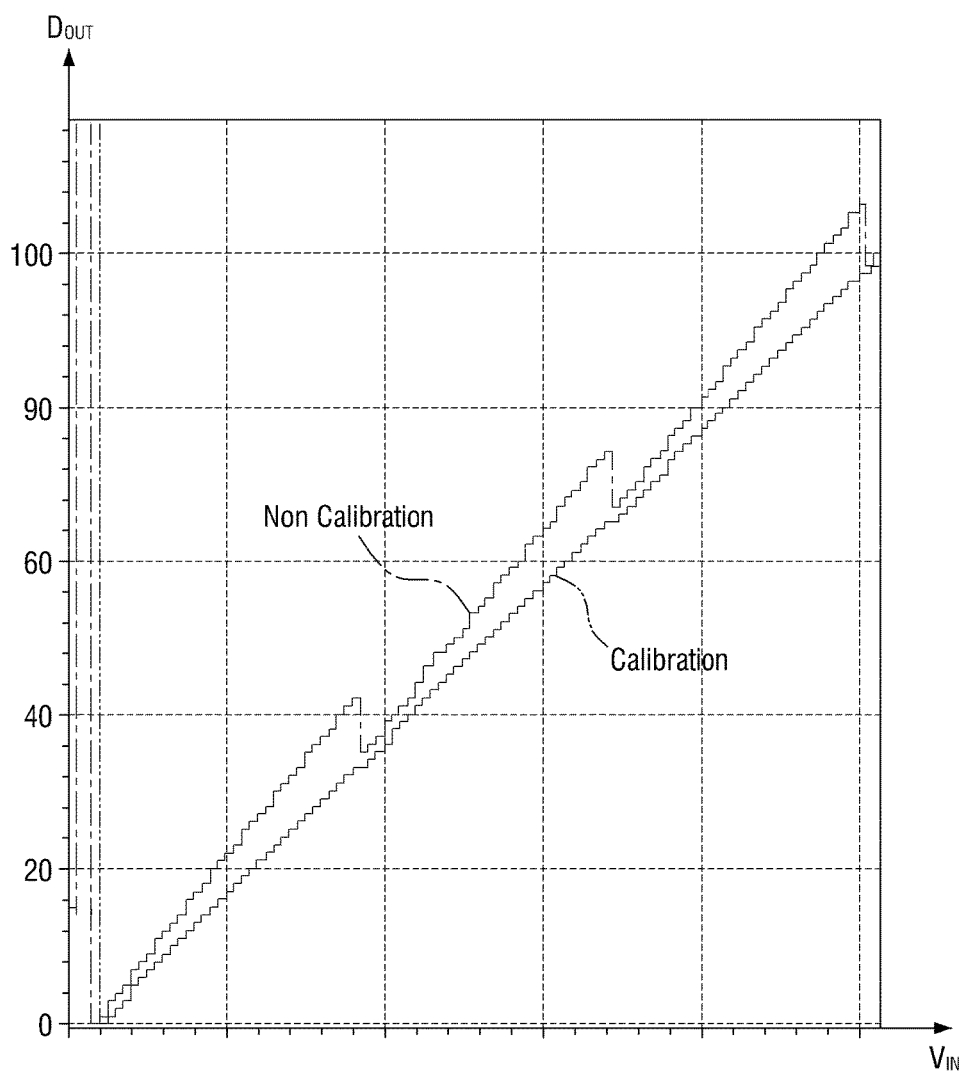
FIGS. 13 and 14 are diagrams illustrating characteristics of an ADC with or without the use of a ramp signal calibration apparatus and method according to one or more exemplary embodiments.
Figure 14:
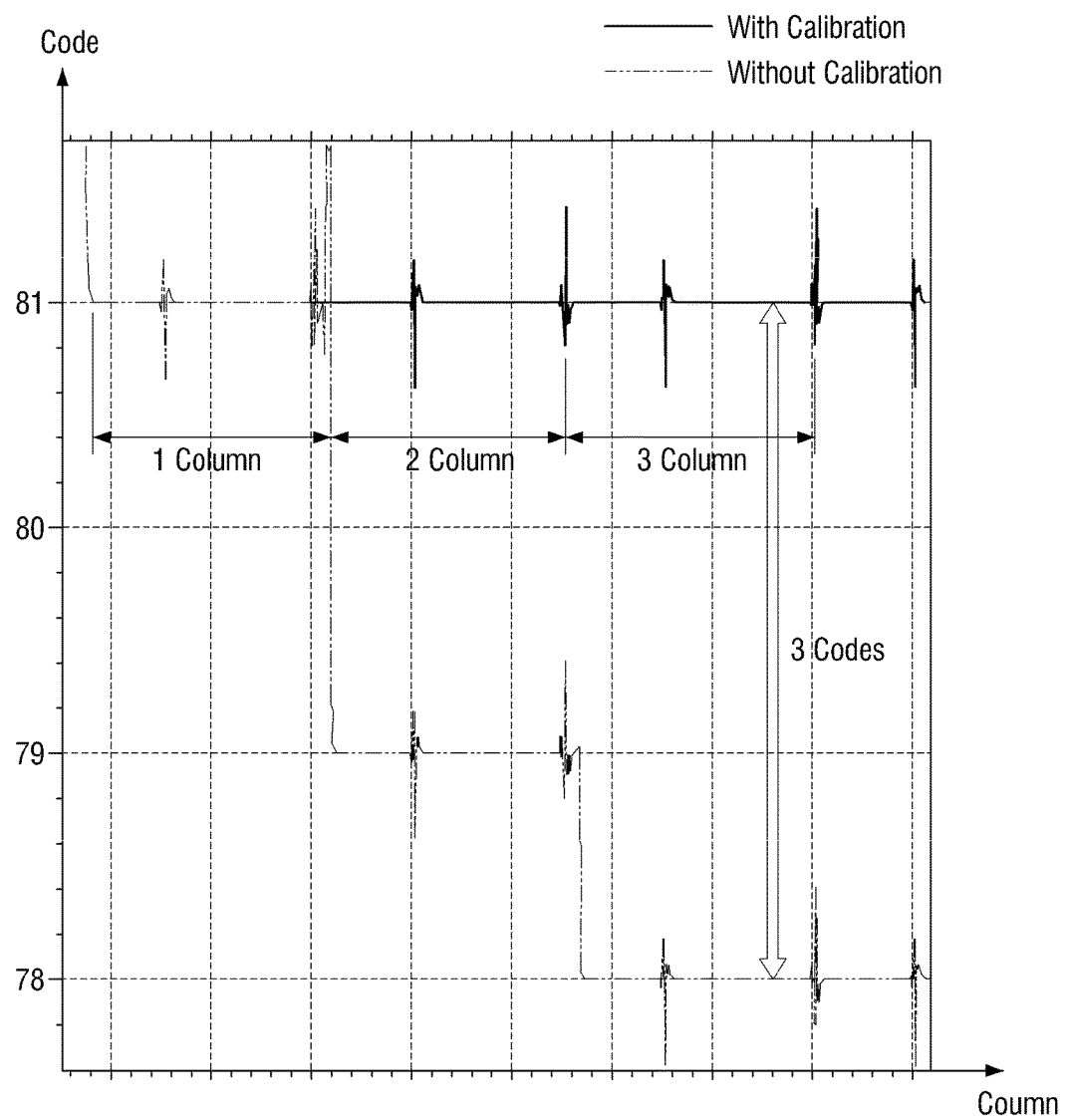

FIGS. 13 and 14 are diagrams illustrating characteristics of an ADC 1000 with or without the use of a ramp signal calibration apparatus and method according to one or more exemplary embodiments.

The graph of FIG. 13 illustrates a digital output of the ADC 1000 in a case where a linear voltage is applied to the ADC 1000. The x axis of the graph represents input voltage, and the y axis of the graph represents digital output.

In a normal state, since a linear voltage of a ramp signal is applied to the ADC 1000, the digital output of the ADC 1000 should also have linearity. However, as the slope of the fine ramp signal Vf decreases, the number of codes of the fine ramp signal Vf output in each section becomes greater than that in the normal state. As a result, the linearity of the digital output may be reduced as illustrated in FIG. 13.

When the slope of the ramp signal increases or decreases as described above, a ratio of the slope of the coarse ramp signal Vc and the slope of the fine ramp signal Vf may be maintained constant by calibrating the slope of the ramp signal. The problem of the changing slope of the ramp signal may occur in each column of the image sensor 2000. Therefore, the calibration circuit 1200 according to an exemplary embodiment is able to maintain the linearity of the output of each ADC 1000 by calibrating the slope of the ramp signal for the ADC 1000 in each column.

FIG. 14 is a graph illustrating the digital output of an ADC 1000 in each column. The x axis of the graph represents column, and the y axis of the graph represents the number of digital codes.

Without the calibration circuit 1200 according to an exemplary embodiment, the slope of the ramp signal may change in each column. Therefore, the number of digital codes output from the ADC 1000 in each column may not be constant. On the other hand, with the calibration circuit 1200 according to an exemplary embodiment, the number of digital codes output from the ADC 1000 in each column may be maintained constant.

The calibration circuit 1200 according to one or more exemplary embodiments can individually adjust the gain values gm of all ADCs 1000. Thus, the calibration circuit 1200 can make error corrections for all columns individually. Accordingly, the calibration circuit 1200 can improve the linearity of the image sensor 2000 and reduce fixed pattern noise (FPN) generated in each column.

Figure 15:
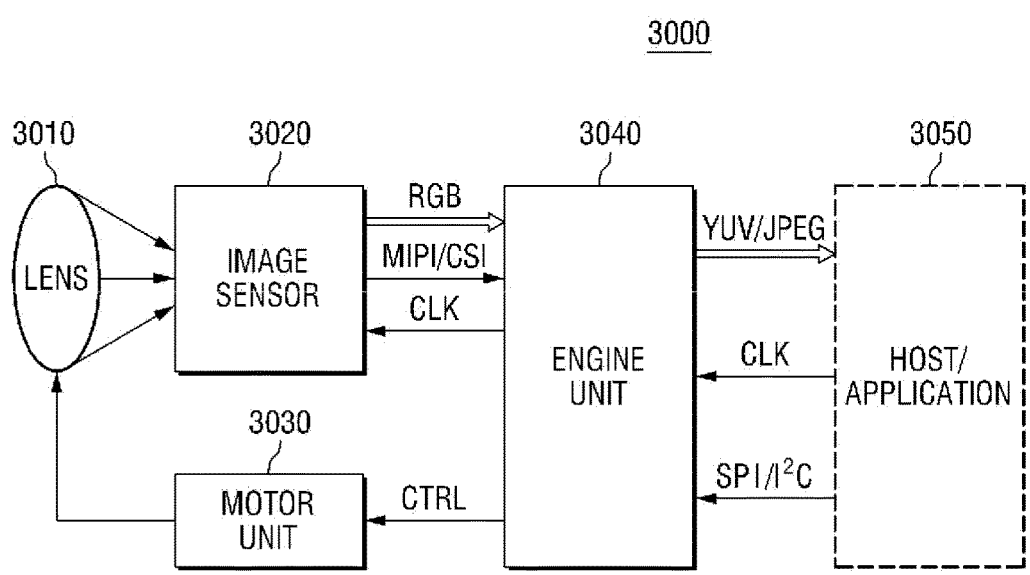
FIG. 15 is a block diagram of an example of a digital camera using an image sensor according to an exemplary embodiment.

FIG. 15 is a block diagram of an example of a digital camera 3000 using an image sensor according to an exemplary embodiment.

Referring to FIG. 15, a digital camera 3000 may include a lens 3010, an image sensor 3020, a motor unit 3030 (e.g., motor), and an engine unit 3040 (e.g., engine). The image sensor 3020 may be any one of the image sensors according to the above-described exemplary embodiments.

The lens 3010 focuses incident light onto a light-receiving region of the image sensor 3020. The image sensor 3020 may generate RGB data RGB in a Bayer pattern based on light received through the lens 3010. The image sensor 3020 may provide the RGB data RGB based on a clock signal CLK.

In some exemplary embodiments, the image sensor 3020 may interface with the engine unit 3040 using a mobile industry processor interface (MIPI) and/or a camera serial interface (CSI).

The motor unit 3030 may adjust the focus of the lens 3010 or perform shuttering in response to a control signal CTRL received from the engine unit 3040. The engine unit 3040 may control the image sensor 3020 and the motor unit 3030. In addition, the engine unit 3040 may generate YUV data YUV including a luminance component, a difference between the luminance component and a blue component, and a difference between the luminance component and a red component or generate compressed data, e.g., Joint Photography Experts Group (JPEG) data based on the RGB data RGB received from the image sensor 3020.

The engine unit 3040 may be connected to a host/application 3050 and may provide the YUV data YUV or the JPEG data to the host/application 3050 based on a master clock MCLK. In addition, the engine unit 3040 may interface with the host/application 3050 using a serial peripheral interface (SPI) and/or an inter-integrated circuit (I²C).

Figure 16:
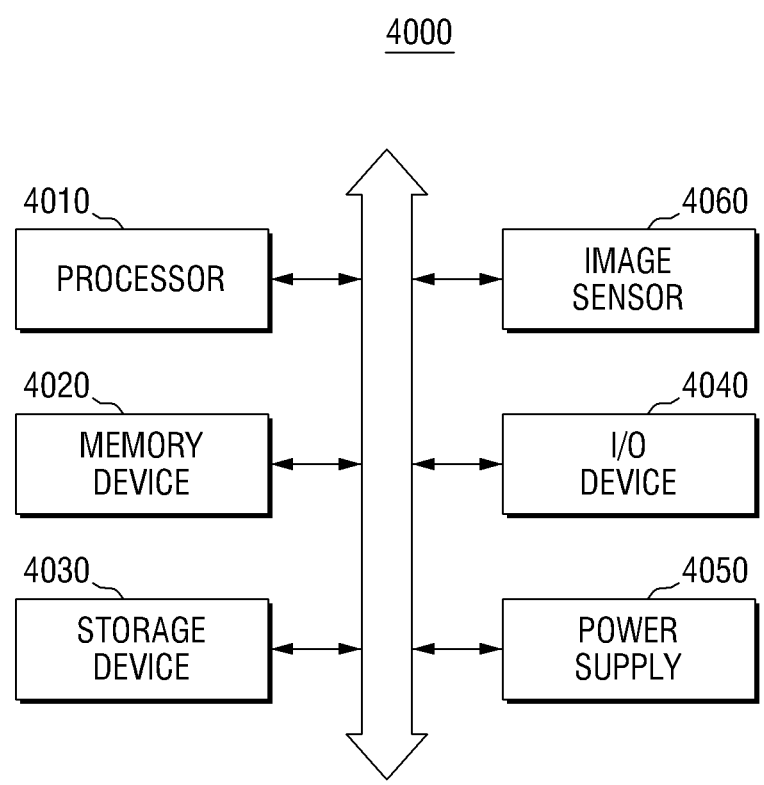
FIG. 16 is a block diagram of an example of a computing system using an image sensor according to an exemplary embodiment.

FIG. 16 is a block diagram of an example of a computing system 4000 using an image sensor 4060 according to an exemplary embodiment.

Referring to FIG. 16, a computing system 4000 may include a processor 4010, a memory device 4020, a storage device 4030, an input/output (11O) device 4040, a power supply 4050, and an image sensor 4060.

The image sensor 4060 may be any one of the image sensors according to the above-described exemplary embodiments. The computing system 4000 may further include ports that can coni unicate with a video card, a sound card, a memory card, a USB device, and/or other electronic devices.

The processor 4010 may perform various calculations or tasks. Depending on an exemplary embodiment, the processor 4010 may be a microprocessor or a central processing unit (CPU).

The processor 4010 may communicate with the memory device 4020, the storage device 4030, and the I/O device 4040 through an address bus, a control bus, and/or a data bus Depending on an exemplary embodiment, the processor 4010 may be coupled to an extended bus, such as a peripheral component interconnection (PCI) bus.

The memory device 4020 may store data for the operation of the computing system 4000.

For example, the memory device 4020 may he implemented as a dynamic random access memory (DRAM), a mobile DRAM, a static random access memory (SRAM), a phase random access memory (PRAM), a ferroelectric random access memory (FRAM), a resistive random access memory (RRAM), and/or a magnetic random access memory (MRAM). The storage device 4030 may include a solid state drive (SSD), a hard disk drive (HDD), an optical storage medium (e.g., a compact disc (CD), a digital versatile disc (DVD), a Blu-Ray disc), a flash memory, a universal serial bus device, a storage card, etc.

The I/O device 4040 may include an input device (e.g., a keyboard, a keypad, a mouse, etc.) and an output device (e.g., a printer, a display, etc.). The power supply 4050 may supply an operating voltage for the operation of the computing system 4000.

The image sensor 4060 may be connected to and communicate with the processor 4010 via buses or other communication links. The image sensor 4060 and the processor 4010 may be integrated together onto a single chip or may be integrated separately onto different chips, respectively.

The computing system 4000 may be any type of computing system using an image sensor. For example, the computing system 4000 may be a personal computer (PC), an digital camera, a mobile phone, a personal digital assistant (PDA), a portable multimedia player (PMP), a smart phone, a tablet PC, etc.

In some exemplary embodiments, the computing system 4000 may be a PC, an Ultra Mobile PC (UMPC), a work station, a net-book, a portable computer, a wireless phone, a mobile phone, an e-book, a portable game console, a navigation device, a black box, a three-dimensional television, a digital audio recorder, a digital audio player, a digital picture recorder, a digital picture player, a digital video recorder, a digital video player, etc.

Figure 17:
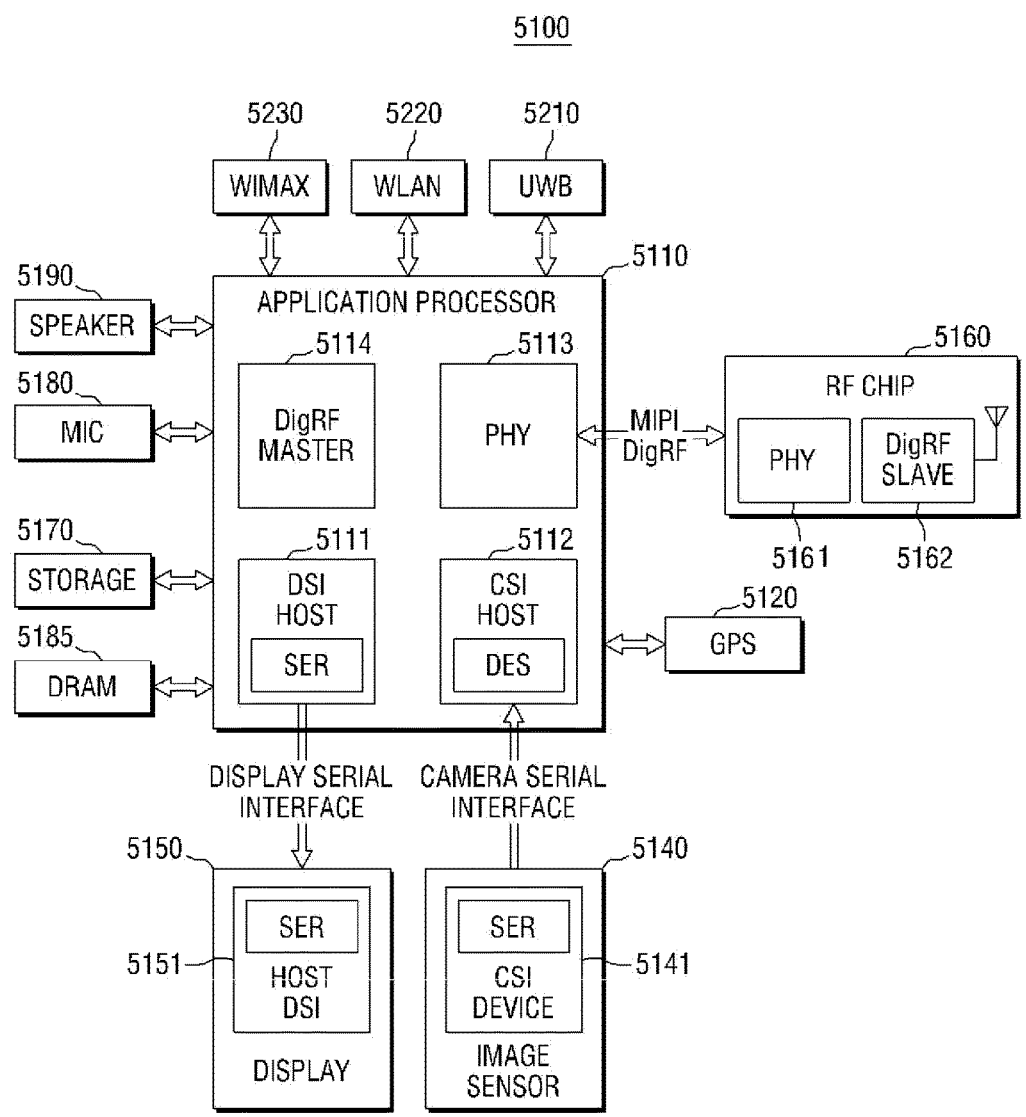
FIG. 17 is a block diagram of an example of interfaces used in a computing system according to an exemplary embodiment.

FIG. 17 is a block diagram of an example of interfaces used in a computing system 5100 according to an exemplary embodiment (e.g., the computing system 4000 of FIG. 16).

Referring to FIG. 17, a computing system 5100 may be implemented as a data processing device that uses or supports a MIPI. The computing system 5100 may include a system on chip (e.g., an application processor 5110), an image sensor 5140, and a display 5150.

A CSI host 5112 of the application processor 5110 may perform serial communication with a CSI device 5141 of the image sensor 5140 via a CSI.

In some exemplary embodiments, the CSI host 5112 may include a deserializer (DES), and the CSI device 5141 may include a serializer (SER). A display serial interface (DSI) host 5111 of the application processor 5110 may perform serial communication with a DSI device 5151 of the display 5150 via a DSI.

In some exemplary embodiments, the DSI host 5111 may include an SER, and the DSI device 5151 may include a DES. The computing system 5100 may further include a radio frequency (RE) chip 5160 that can communicate with the application processor 5110. A physical layer (PHY) 5113 of the computing system 5100 and a PHY 5161 of the RE chip 5160 may perform data communications based on a NM DigRF.

The application processor 5110 may further include a DigRF MASTER 5114 which controls the data communication of a DigRF SLAVE 5162 through the PHY 5161 based on the MIPI DigRF. The computing system 5100 may further include a global positioning system GPS) 5120, a storage 5170, a microphone 5180, a memory (e.g., a DRAM 5185), and a speaker 5190. In addition, the computing system 5100 may perform communications using an ultra wideband (UWB) 5120, a wireless local area network (WLAN) 5220, a worldwide interoperability for microwave access (WIMAX) 5230, etc. However, the above structure and interfaces of the computing system 5100 are merely an example, and it is understood that one or more other exemplary embodiments are not limited thereto.

While exemplary embodiments have been particularly shown and described above, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A ramp signal calibration apparatus comprising:
    an analog-to-digital converter (ADC) comprising a trimmable transistor having a gain value that varies according to stored data, the ADC configured to receive a ramp signal in a state where the gain value is set to a first gain value, and to output a first output signal and a second output signal based on the received ramp signal;
    a subtractor configured to calculate a difference between the first output signal and the second output signal;
    a digital comparator configured to compare the calculated difference with a reference value and to determine whether a slope of the ramp signal has changed based on a result of the comparing; and
    a counter configured to change the stored data based on the determining of whether the slope of the ramp signal has changed;
    wherein when the counter changes the stored data, the first gain value of the trimmable transistor is changed to a second gain value according to the changed data,
    wherein the trimmable transistor comprises a reference transistor, N metal oxide semiconductor (MOS) transistors, and N switches connected in parallel, and each of the N switches is disposed on a side of each of the N MOS transistors, respectively, and the N switches are turned on or off according to the data, and
    wherein the ramp signal comprises a coarse ramp signal and a fine ramp signal, the first output signal comprises an output of the fine ramp signal, which corresponds to a first level of the coarse ramp signal, and the second output signal comprises an output of the fine ramp signal, which corresponds to a second level of the coarse ramp signal, and a difference between the second level and the first level corresponds to a least significant bit (LSB) of the coarse ramp signal.

2. The apparatus of claim 1, wherein the data is stored as a binary code of N bits, the N bits corresponding to the N MOS transistors, respectively.

3. The apparatus of claim 1, wherein the calculated difference between the first output signal and the second output signal indicates an output resolution of the ADC, and the reference value indicates a predetermined reference resolution of the ADC.

4. The apparatus of claim 1, wherein:
    the ADC further comprises a comparator, a parallel load counter (PLC), a first memory, and a second memory;
    the comparator is configured to compare a pixel signal of an image pixel with the coarse ramp signal or the fine ramp signal included in the ramp signal; and
    the PLC is configured to perform an addition processing on a digital signal by measuring a comparison time from an initiation of a comparison operation of the comparator to a termination of the comparison operation of the comparator.

5. The apparatus of claim 4, wherein:
    the comparator comprises:
        an amplifier configured to receive the pixel signal, a reference voltage, the fine ramp signal, and the coarse ramp signal, a switch which is disposed between the amplifier and a coarse ramp signal input terminal that receives the coarse ramp signal, and a capacitor which has an end connected between the switch and the amplifier and another end connected to a ground source, wherein the coarse ramp signal is transmitted to the amplifier when the switch is turned on and is stored in the capacitor when the switch is turned off.

6. The apparatus of claim 4, wherein the ADC operates as a two-step single slope ADC.

7. An image sensor comprising:

a pixel array comprising unit pixels arranged two-dimensionally in a matrix pattern and vertical signal lines respectively corresponding to columns of the matrix pattern;

a plurality of analog-to-digital converters (ADCs), each of which comprises a memory configured to store data and a trimmable transistor having a gain value that varies according to the data stored in the memory, and each of which is configured to receive a ramp signal in a state where the gain value is set to a first gain value, and to convert an analog signal output through a corresponding vertical signal line, among the vertical signal lines, into a digital signal; and a calibration circuit connected to the memory of each of the plurality of ADCs and configured to calibrate the gain value of each of the plurality of ADCs, wherein the calibration circuit changes the data stored in the memory by determining whether a slope of the ramp signal has changed, and the first gain value of the trimmable transistor is changed to a second gain value according to the changed data stored in the memory, wherein the trimmable transistor comprises a reference transistor, N metal oxide semiconductor (MOS) transistors, and N switches connected in parallel, and each of the N switches is disposed on a side of each of the N MOS transistors, respectively, and the N switches are turned on or off according to the data.

8. The image sensor of claim 7, wherein:

the calibration circuit comprises a subtractor, a digital comparator, and a counter; and each of the plurality of ADCs is configured to output a first output signal and a second output signal based on the received ramp signal, the subtractor is configured to calculate a difference between the first output signal and the second output signal, the digital comparator is configured to compare the calculated difference with a reference value and to determine whether the slope of the ramp signal has changed based on a result of the comparing, and the counter is configured to change the data stored in the memory based on the determining of whether the slope of the ramp signal has changed.

9. The image sensor of claim 8, wherein the counter is configured to increase the gain value when the calculated difference is greater than the reference value and to decrease the gain value when the calculated difference is less than the reference value.

10. The image sensor of claim 8, wherein:

the ramp signal comprises a coarse ramp signal and a fine ramp signal, the first output signal comprises an output of the fine ramp signal, which corresponds to a first level of the coarse ramp signal, and the second output signal comprises an output of the fine ramp signal, which corresponds to a second level of the coarse ramp signal; and a difference between the second level and the first level corresponds to a least significant bit (LSB) of the coarse ramp signal.

11. The image sensor of claim 10, wherein the data is stored as a binary code of N bits respectively corresponding to the N MOS transistors, and the calibration circuit is configured to increase or decrease the stored data by one bit in each calibration operation.

12. The image sensor of claim 7, wherein the calibration circuit is configured to calibrate the gain values of the plurality of ADCs in an order in which the vertical signal lines are read.

13. The image sensor of claim 12, wherein the calibration circuit is configured to perform $2^{(N-1)}$ calibration operations for the gain values of the plurality of ADCs.

14. A calibration circuit configured to calibrate a gain value of each of a plurality of analog-to-digital converters (ADCs), the calibration circuit comprising:

a subtractor configured to obtain, from an ADC among the plurality of ADCs, a first output signal and a second output signal corresponding to a ramp signal, and to calculate a difference between the first output signal and the second output signal;

a comparator configured to compare the calculated difference with a reference value and to determine whether a slope of the ramp signal has changed based on a result of the comparing; and a counter configured to change the gain value of the ADC based on the determining of whether the slope of the ramp signal has changed, wherein the ramp signal comprises a coarse ramp signal and a fine ramp signal, the first output signal comprises an output of the fine ramp signal, which corresponds to a first level of the coarse ramp signal, and the second output signal comprises an output of the fine ramp signal, which corresponds to a second level of the coarse ramp signal;

a difference between the second level and the first level corresponds to a least significant bit (LSB) of the coarse ramp signal; and the calculated difference between the first output signal and the second output signal indicates an output resolution of the ADC, and the reference value indicates a predetermined reference resolution of the ADC.

15. The calibration circuit of claim 14, wherein the counter is configured to increase the gain value when the calculated difference is greater than the reference value and to decrease the gain value when the calculated difference is less than the reference value.

16. The calibration circuit of claim 14, wherein the counter is configured to obtain data from the ADC, and to change the gain value based on the determining of whether the slope of the ramp signal has changed by changing the obtained data and storing the changed data in the ADC.

17. The calibration circuit of claim 16, further comprising:

a precharger and a sense amplifier configured to amplify the data obtained from the ADC, wherein the counter is configured to obtain the amplified data from the ADC through the precharger and the sense amplifier.

* * * * *